(12) United States Patent
Haase et al.

(10) Patent No.: US 8,885,760 B2
(45) Date of Patent: Nov. 11, 2014

(54) METHOD AND CIRCUIT FOR SIGNAL TRANSMISSION VIA A CURRENT LOOP

(75) Inventors: Bjorn Haase, Stuttgart (DE); Bernd Maringer, Schwieberdingen (DE)

(73) Assignee: Endress + Hauser Conducta Gesellschaft für Mess- und Regeltechnik mbH + Co. KG, Gerlingen (DE)

( * ) Notice: Subject to any disclaimer, the term of this patent is extended or adjusted under 35 U.S.C. 154(b) by 164 days.

(21) Appl. No.: 13/258,086

(22) PCT Filed: Mar. 23, 2010

(86) PCT No.: PCT/EP2010/053787
§ 371 (c)(1),
(2), (4) Date: Sep. 21, 2011

(87) PCT Pub. No.: WO2010/108924
PCT Pub. Date: Sep. 30, 2010

(65) Prior Publication Data
US 2012/0020430 A1 Jan. 26, 2012

(30) Foreign Application Priority Data

Mar. 25, 2009 (DE) .......................... 10 2009 001 863
Dec. 21, 2009 (DE) .......................... 10 2009 055 111

(51) Int. Cl.
| | |
|---|---|
| H04L 27/00 | (2006.01) |
| H03M 7/30 | (2006.01) |
| H04L 5/06 | (2006.01) |
| H04L 12/40 | (2006.01) |
| H03M 3/00 | (2006.01) |

(52) U.S. Cl.
CPC .............. *H04L 5/06* (2013.01); *H03M 7/3028* (2013.01); *H04L 12/40013* (2013.01); *H03M 3/462* (2013.01); *H03M 3/438* (2013.01)
USPC ........................................................ 375/295

(58) Field of Classification Search
USPC ........................................................ 375/295
See application file for complete search history.

(56) References Cited

U.S. PATENT DOCUMENTS

| | | | |
|---|---|---|---|
| 6,137,827 A | 10/2000 | Scott et al. | |
| 6,611,537 B1 * | 8/2003 | Edens et al. | 370/503 |

(Continued)

FOREIGN PATENT DOCUMENTS

| | | |
|---|---|---|
| DE | 69508424 | 9/1999 |
| DE | 102004052490 | 7/2006 |

(Continued)

OTHER PUBLICATIONS

German Search Report in corresponding German Application No. 10 2009 001 863.8.

(Continued)

*Primary Examiner* — Khai Tran
*Assistant Examiner* — Bahman Badipour
(74) *Attorney, Agent, or Firm* — Bacon & Thomas, PLLC

(57) ABSTRACT

A method for signal transmission between a first and a second system; wherein the first and the second system are connected with one another via a current loop. A direct current signal is transmitted in a first frequency range and an alternating current signal in a second frequency range via the current loop. The direct current signal and the alternating current signal are superimposed and the alternating current signal is used for digital signal transmission and the direct current signal is used for analog signal transmission. By means of a control unit, a first data stream is produced, in which the direct current signal and alternating current signal to be set in the current loop are digitally encrypted. The first data stream is transmitted to an electrical current output circuit and the transmitted first data stream is converted by the electrical current output circuit into an electrical current signal. The electrical current signal is composed of the superimposed direct current signal and alternating current signal, or the transmitted first data stream is converted by the electrical current output circuit into the direct current signal and the alternating current signal. The electrical current signal or the direct current signal and the alternating current signal are set in the current loop.

48 Claims, 18 Drawing Sheets

(56) References Cited

U.S. PATENT DOCUMENTS

| | | | | |
|---|---|---|---|---|
| 6,837,747 | B1* | 1/2005 | Kosmala | 439/620.09 |
| 7,176,821 | B1* | 2/2007 | Williams et al. | 341/143 |
| 7,373,281 | B2* | 5/2008 | Pupalaikis et al. | 702/189 |
| 7,653,514 | B2* | 1/2010 | Pupalaikis et al. | 702/189 |
| 7,656,985 | B1* | 2/2010 | Aweya et al. | 375/373 |
| 7,792,228 | B2* | 9/2010 | Yoon | 375/350 |
| 8,073,656 | B2* | 12/2011 | Pupalaikis et al. | 702/189 |
| 8,180,081 | B2* | 5/2012 | Lunner | 381/318 |
| 2004/0017353 | A1* | 1/2004 | Anton et al. | 345/156 |
| 2004/0052310 | A1* | 3/2004 | Noguchi et al. | 375/243 |
| 2005/0094714 | A1* | 5/2005 | Robinson | 375/148 |
| 2005/0242979 | A1 | 11/2005 | Hamilton et al. | |
| 2006/0029146 | A1* | 2/2006 | Catreux et al. | 375/267 |
| 2006/0164159 | A1* | 7/2006 | Kimura | 327/552 |
| 2007/0021090 | A1* | 1/2007 | Wetzker et al. | 455/324 |
| 2007/0022444 | A1* | 1/2007 | Santhoff | 725/69 |
| 2007/0086554 | A1* | 4/2007 | Tominaga et al. | 375/372 |
| 2007/0091988 | A1* | 4/2007 | Sadri et al. | 375/219 |
| 2007/0206643 | A1* | 9/2007 | Egan et al. | 370/479 |
| 2008/0114911 | A1* | 5/2008 | Schumacher | 710/72 |
| 2008/0117965 | A1* | 5/2008 | Vysotsky et al. | 375/240.01 |
| 2009/0072994 | A1 | 3/2009 | Kleven et al. | |
| 2009/0135970 | A1* | 5/2009 | Miyagi et al. | 375/345 |
| 2009/0267925 | A1* | 10/2009 | Tsao et al. | 345/204 |
| 2010/0100643 | A1* | 4/2010 | Shim et al. | 710/1 |
| 2011/0122972 | A1* | 5/2011 | Lie et al. | 375/316 |
| 2011/0130176 | A1* | 6/2011 | Magrath et al. | 455/570 |
| 2012/0041720 | A1* | 2/2012 | Pupalaikis et al. | 702/189 |
| 2012/0275608 | A1* | 11/2012 | Amadu et al. | 381/22 |
| 2013/0004173 | A1* | 1/2013 | Maricevic et al. | 398/76 |

FOREIGN PATENT DOCUMENTS

| | | |
|---|---|---|
| DE | 69835808 | 9/2007 |
| DE | 102006009506 | 9/2007 |
| DE | 102007035710 | 2/2009 |
| EP | 1860513 | 11/2007 |

OTHER PUBLICATIONS

International Search Report in corresponding International Appln. No. PCT/EP2010/053268.

Wallace A. Pratt Jr., "Remote Monitoring Using HART Protocol", Advances in Instrumentation and Control, vol. 50, No. Part 3, Oct. 1995, pp. 993-1001.

English translation of the International Preliminary Examination Report.

* cited by examiner

Generated number series for 3-Bit "sine" (30 values per period)

Generated number series for 4-Bit alternative (30 value per period)

METHOD AND CIRCUIT FOR SIGNAL TRANSMISSION VIA A CURRENT LOOP

TECHNICAL FIELD

The invention relates to a method for signal transmission between a first and a second system, wherein the first and the second system are in connection with one another via a current loop, wherein a direct current signal is transmitted in a first frequency range and an alternating current signal in a second frequency range via the current loop, wherein the direct current signal and the alternating current signal are superimposed, wherein the alternating current signal is used for digital signal transmission and the direct current signal is used for analog signal transmission.

Furthermore, the invention relates to an electrical and/or electronic circuit for signal transmission between a first and a second system, wherein the first and the second system are in connection with one another via a current loop, wherein the current loop serves to transmit a direct current signal in a first frequency range and an alternating current signal in a second frequency range, wherein the alternating current signal and the direct current signal are superimposed, wherein the direct current signal serves for analog signal transmission and the alternating current signal serves for digital signal transmission.

BACKGROUND DISCUSSION

In the process automation industry, field devices are often applied which serve for registering and/or influencing process variables. Examples of such field devices are fill level measuring devices, pressure and temperature measuring devices, pH measuring devices, conductivity measuring devices, valve controls, etc., which, as sensors, register, or, as actuators, control process variables such as fill level, flow, pressure, temperature, pH value or conductivity.

A large number of such field devices is produced and sold by the firm Endress+Hauser©.

Field devices are frequently connected with superordinated units, e.g. process control systems or controllers. These superordinated units serve for process monitoring, process control or process visualizing.

Signal transmission between field devices and superordinated units frequently occurs according to the 4 to 20 mA standard, via a two-conductor current loop. If the field devices in question are sensors, the measured values registered by them are transmitted as a direct current signal via the two-conductor current loop to the superordinated units. The measuring range of the sensors is, in such case, linearly mapped to a 4 to 20 mA direct current. Normally, this direct current signal is produced not in the superordinated unit, but instead in a separate measurement transmitter supply device, which is connected with the two-conductor current loop.

Intelligent field devices partially possess extensive diagnosis or configuration options, which, for example, concern information regarding the maintenance state of sensors, enable parametering the measuring ranges or indicate to the user an imminent failure of the device.

Such diagnostic information cannot easily be encoded in a 4 to 20 mA direct current signal. A solution which enables such diagnosis or configuration options while maintaining the physical, two-conductor, electrical current loop wiring can be developed with the use of digital communication. A widespread standard for digital communication via a two-conductor current loop is the so-called "HART" standard (acronym for "Highway Addressable Remote Transducer").

In the case of this standard, signal transmission is carried out via the current loop in a frequency F-multiplex operation (see also FIG. 2). In the frequency band under 30 Hz—the so-called "analog band", the measured variable is encoded in an analog manner via a direct current signal between 4 and 20 mA. Compatibility with existing pure analog sensors without diagnosis or maintenance functionality is therewith assured. The frequency band between 100 Hz and around 10 kHz is utilized for the transmission of digital data. These frequencies are achieved via an alternating current signal superimposed on the direct current signal. Two standards for use of this frequency band are in use: Bell 202 with a baud rate of 1200 Hz and a PSK modulation with a baud rate of 4800 Hz. In spite of the higher physical transmission rate, PSK modulation is often not used today due to the higher technical difficulty in the case of the modulation and demodulation.

For the use of field devices in an explosion-endangered area, in which precautionary measures against ignition sparks are imperative, measures regarding operational safety are required. A measure for assuring operational safety is to galvanically isolate electrical circuits in the measuring transducer or measurement transmitter.

A negative of galvanic isolation is the increased circuit complexity. It is especially necessary to transmit the measured variable from the measuring transducer across the galvanic barrier into the current loop, which is galvanically coupled with the superordinated unit. Apparatuses for this transmission are already known from the state of the art, e.g. from DE 698 35 808 T2.

The advantages of the galvanic barrier stand in opposition to the fact that the latter also forms an impediment for diagnostic information. Thus, for example, an error occurring in the current loop is not directly communicated with the field device. Should, for example, the electrical current flowing in the current loop be monitored by the electronics of the field device, it is necessary to provide apparatuses for transmission of a control variable across the galvanic barrier, which enables conclusions concerning the electrical current actually flowing in the current loop. Such control functions are of especially high importance for safety-critical applications, in the case of which the field device must detect malfunctions. Such control functions are, among other things, prescribed by standards such as SIL2 (acronym for "Safety Integrity Level 2") for safety-critical applications.

If analog measuring signals are transmitted between galvanically isolated regions, these can be corrupted by aging of the coupling elements. For this reason, it is advantageous to transmit exclusively digital signals between the galvanically isolated regions. The costs caused by the galvanic isolation increase with the number of lines required therefor. A minimizing of the number of lines connecting the regions galvanically isolated from one another is, consequently, to be strived for.

SUMMARY OF THE INVENTION

An object of the invention is to provide a simpler signal transmission.

The object as regards of the method is achieved according to the invention in that, by means of a control unit, a first data stream is produced, in which the direct current signal and alternating current signal to be set in the current loop are digitally encrypted, in that the first data stream is transmitted to an electrical current output circuit, in that the transmitted first data stream is converted by the electrical current output circuit into an electrical current signal, wherein the electrical current signal is composed of the superimposed direct current signal and alternating current signal, or that the transmitted first data stream is converted by the electrical current output circuit into the direct current signal and the alternating current signal, and that the electrical current signal or the direct current signal and the alternating current signal are set in the current loop.

The first system can, as already mentioned, be a field device of process automation technology. Such a field device is often connected via a current loop, especially via a two-conductor current loop, with a second system, for example, with a superordinated unit, for instance a control system or a process controller. Via the current loop, a direct current signal—which, for example, represents a measured value recorded by a measuring transducer/sensor—and an alternating current signal—which, for example, contains other process-relevant data such as, for example, parameter settings—can be transmitted from the first system to the second system, or vice versa. The direct current signal and the alternating current signal are superimposed in the current loop, and the resulting electrical current signal set in the current loop is a mixed current with a DC fraction and an AC fraction. By means of the control unit, which, for example, can belong to the first system, and the electrical current output circuit, which, for example, can likewise belong to the first system, the direct current signal and the alternating current signal can be produced and set in the current loop. The first data stream can, for example, be produced and output by means of the control unit. The control unit can be a digital, especially program-controlled, computational unit. Such a control unit, for example, a central processing unit or a field programmable gate array, is often in any event present in a field device, in order to assure a desired functionality of the field device—especially in order to enable communication with the field device. The control unit can also be composed of a plurality of components, such as, for example, a computational unit and a register connected thereto or additional electrical and/or electronic components.

In the first data stream, the direct current signal and alternating current signal to be set in the current loop are encrypted in a digital, preferably binary, manner. The first data stream can be, for example, composed of a sequence of bits, a so-called bit stream. The information encrypted in the first data stream includes, for example, a sequence ordered in time and can continually be produced and further processed. There exists, moreover, the opportunity to process the first data stream sequentially. The electrical current output circuit serves, for example, to convert the transmitted first data stream into the direct current signal and the alternating current signal. The first data stream can be, for example, converted directly from the electrical current output circuit into the electrical current signal to be set in the current loop, this electrical current signal being composed of the superimposed direct current signal and alternating current signal. Alternatively, the opportunity exists to separate a part of the first data stream which contains the direct current signal (in digitally encrypted form) from another part of the first data stream which contains the alternating current signal (in digitally encrypted form), and to convert separately from one another the part which contains the direct current signal and the other part which contains the alternating current signal into the analog direct current signal and the analog alternating current signal, respectively. Then, the alternating current signal can be coupled to the direct current signal and set in the current loop.

With the aid of the first data stream, which contains the alternating current signal and direct current signal to be set in the current loop in digitally encrypted form, the two signals can be transmitted via a single signal line or data line to the electrical current output circuit. There results the advantage therefrom that such a transmission can be implemented with a small number of electrical and/or electronic components, and the signal transmission between the first and the second system, as well as also the transmission of signals between the control unit and the electrical current output circuit, is thereby simplified.

In an embodiment of the method, at least one control signal, in which the alternating current signal and direct current signal to be set in the current loop are digitally encrypted, is produced by the control unit. The first data stream can, for example, be formed from the control signal produced by the control unit, or the control signal can be combined and/or converted into the first data stream. The data stream can, for example, be composed of the control signal, wherein the control signal contains in digitally encrypted form the direct current signal and alternating current signal to be set. Alternatively, the first data stream can be produced by means of the control signal produced by the control unit, or derived therefrom. In a variant, the at least one control signal is transmitted from the control unit to an electrical and/or electronic auxiliary unit, which derives and/or produces the first data stream from the control signal. A number of control signals which serve for producing the first data stream can especially also be produced by the control unit.

In another embodiment of the method, at least a first control signal is produced by the control unit, in which the alternating current signal to be set in the current loop is digitally encrypted, and at least a second control signal is produced by the control unit, in which the direct current signal to be set in the current loop is digitally encrypted. The first and the second control signal can be combined and/or converted into the first data stream. In this way, the hardware required for signal transmission can be reduced. Furthermore, the direct current signal and the alternating current signal can thereby be produced independently from one another.

In an additional embodiment, by means of the first control signal, at least one numerical value is produced, which corresponds to the alternating current signal to be set. The numerical value can especially be variable in time, and this change over time can correspond to the alternating current signal to be set. The alternating current signal can, as already mentioned, be sinusoidal in the case of the HART standard, so that, for example, digital data can be transmitted via an FSK modulation. This sinusoidal signal, also referred to as a sine signal, can be approximated by the at least one numerical value.

In an additional embodiment, by means of the first control signal, a sequence of numerical values is produced, wherein the sequence corresponds to the alternating current signal to be set. In the sequence of numerical values, a sine signal can be encrypted—especially a frequency-modulated (also referred to as FSK modulation) sine signal—which corresponds to the alternating current signal to be set. The sine signal can be approximated by the sequence of discrete numerical values. For producing the at least one numerical value or the sequence of numerical values, a digital switching unit, for example, can be used.

In an additional embodiment, the numerical value or individual numerical values of the sequence are produced in a format with a bit width of n bits, wherein n is a natural number, especially three or four. It has proved advantageous to represent and to process the numerical values in a format with a bit width of n bits. In such case, the bit width n can in essence be selected as desired. For minimizing computational efforts in the case of the processing the numerical values, it has, however, proved advantageous, to select n so as to be as small as possible. In such case, the bit width n can, for example, be smaller than 100, preferably smaller than 50, and especially preferably smaller than 25. Furthermore, the bit width can be selected so as to be smaller than 10. In this connection, it has proved advantageous to produce the alternating current signal to be set via numerical values with a bit width of 3 bits, or, in another case, with 4 bits. The alternating current signal derived from a numerical value or a sequence of numerical values and set in the current loop includes, in such case, overtones first beginning at a sufficiently high order, so that the alternating current signal set in the current loop has a sufficient signal quality.

In an additional embodiment of the method, by means of the second control signal, a numerical value corresponding to the direct current signal to be set is produced, especially one with a bit width of less than m bits, wherein m is a natural number. For this, the bit width can especially be selected so as to be smaller than 24 bits. For processing, the first and the second control signal can, in an advantageous manner, be produced or be present in a format with a predetermined bit width.

In an embodiment of the method, at least one numerical value of the sequence representing the alternating current signal is scaled especially to the bit width of the numerical value of the DC signal. For processing the two numerical values, these can be brought to the same bit width. In such case, it can be necessary to scale the at least one numerical value or the sequence of numerical values which represent the alternating current signal to be set to the bit width of the numerical value which represents the direct current signal to be set. The scaling can, in such case, occur especially by shifting the bits which form the numerical value of the AC signal to be adjusted.

In a form of embodiment of the method, at least one numerical value of the sequence, which represents the alternating current signal, and the numerical value of the DC signal to be set are brought together, especially added, and converted into the first data stream. In this way, data or signals—and, as a result, also the first data stream—can be produced which contain both the direct current signal to be set as well as also the alternating current signal to be set.

In an additional form of embodiment of the method, the conversion is performed by means of a digital delta-sigma modulator, wherein the digital delta-sigma modulator is operated in the first or second order, dependent on an input value, wherein the input value is dependent on the direct current signal and/or alternating current signal to be set, wherein the input value is derived especially from at least one numerical value of the sequence, which corresponds to the alternating current signal to be set and/or to the numerical value of the DC signal to be set. The first and the second control signal can be converted into the first data stream. For such purpose, a digital delta-sigma modulator can be used, which, for example, is operated in first or second order by means of a suitable circuit unit. Alternatively, an option is to produce the first and the second control signal by means of a first order or second order digital delta-sigma modulator. The input value can also naturally be derived directly from the first and/or second control signal.

In an embodiment of the method, a first order digital delta-sigma modulator and a second order digital delta-sigma modulator can be switched between. The advantage of this switching between the first and second order is, that while second order modulators can indeed better suppress the quantization noise, they require very large bit widths for the internal summation accumulators—i.e.—digital memory, used therefor, when the control range should be utilized in full from the lower limit up to the upper limit. Due to a first and/or second order delta-sigma modulator being switched between, the need for combinatorial logic gates and for flip-flops in the circuit used can be strongly reduced—and therewith the costs of the digital circuit—without losing the opportunity to utilize the control range in full. For switching, the already mentioned input value can then, for example, be used, which is derived from the first and/or second control signal, or from at least one numerical value—especially from the sequence of numerical values—which corresponds to the alternating current signal to be set, and/or which is derived from a numerical value of the DC signal to be set.

In a further development of the method, the direct current signal and alternating current signal set in the current loop are converted into a second data stream, wherein the direct current signal and the alternating current signal are digitally encrypted in the second data stream, and the second data stream is transmitted back from the electrical current output circuit to the control unit. The electrical current signal or direct current signal and alternating current signal set in the current loop can be read back for monitoring purposes. In this way, the functioning of the control unit and the electrical current output circuit can be monitored. This is achieved in a simple manner by the proposed further development, wherein, for the transmitting back, the second data stream is produced, which contains the direct current signal and the alternating current signal set in the current loop in digitally encrypted—especially binary—form. The portions of the DC signal and of the AC signal contained in the second data stream can be isolated from one another and be checked in simple manner. Additionally, due to the digital character of the first and of the second data stream, a control unit exclusively with digital inputs/outputs, for example, can be used for producing and for receipt of the first and of the second data stream, or exclusively digital inputs and outputs of the control unit can be used for producing or receipt of the first and second data stream.

In a further development of the method, the superimposed direct current and alternating current signal set in the current loop is sampled and converted into a second data stream.

In an additional further development of the method, the sampling rate of the second data stream is lessened, especially by means of a decimation filter.

In a further development of the method, from the (especially decimated) second data stream, a first numerical value is ascertained, which represents the direct current and alternating current signal set in the current loop.

In a further development of the method, from the first numerical value, a second numerical value is derived, which corresponds to the direct current signal set in the current loop, and also from the first numerical value, a third numerical value is derived, which corresponds to the alternating current signal set in the current loop. The evaluation of the first numerical value, which especially can again be present in a format with a bit width of p bits, wherein p is a natural number, can be dependent on whether the set alternating current signal and/or the set direct current signal should at the moment be read back and/or be monitored. Like the first numerical value, the second and/or third numerical value can also be in a format with a bit width of q or r bits, wherein q and r are natural numbers.

In an additional further development of the method, a frequency response correction of the sampled and especially decimated direct current and/or alternating current signal is performed.

In an additional embodiment of the method, the third numerical value is converted or decoded, especially by means of a quadrature demodulator, into signals readable by the control unit and transmitted to the control unit.

In a further development of the method, the first data stream and/or the second data stream are transmitted across a galvanic barrier. Via the galvanic barrier, a primary circuit comprising the control unit, for example, is electrically isolated from a secondary circuit comprising at least the electrical current output circuit. If, for example, analog signals, especially measuring signals, are transmitted between the galvanically isolated regions, these signals can be corrupted by aging of the coupling elements. It is, consequently, advantageous to transfer exclusively digital signals between the galvanically isolated systems.

In a further development of the method, by means of the control unit, a value of the DC signal and/or AC signal set in the current loop and transmitted back is compared with a desired value. Due to the digital transmission used, in the case of malfunction, a corresponding error signal can then reliably be output from the control unit.

In a further development of the method, an operating mode is provided, wherein a maximum value of the DC signal settable in the current loop is predetermined by means of the first data stream, and wherein, in this operating mode, the value of the DC signal in the current loop is furthermore limited by a unit provided in the second system to a value smaller than or equal to the maximal value, and wherein, in the operating mode, the value of the DC signal set in the current loop is transmitted via the second data stream to the control unit. As a unit for limiting the DC signal, the second system contains, for example, an electrical current source, which limits the electrical current flowing in the current loop to an actuating value. The direct current signal to be set, transmitted in the first digital data stream, can then be set to a value greater than the maximum value to be expected from the second system, so that the electrical current flowing in the current loop is not limited by the electrical current output circuit of the first system but instead by the unit of the second system provided therefor. In the proposed operating mode, the second digital data stream transmitted back to the control unit thus contains information concerning the actuating value of the DC signal set in the second system by the unit provided for limiting the DC signal.

In an additional embodiment of the method, the alternating current signal set in the current loop is an essentially sinusoidal, alternating current signal, wherein the overtones of the sinusoidal AC signal up to and including the $6^{th}$ order are attenuated by a value of at least 30 dB relative to the amplitude of the fundamental oscillation of the sinusoidal AC signal. The digital switching unit, especially the circuit portion provided for producing the sinusoidal AC signal, i.e. the so-called sine generator, can, for example, be correspondingly designed for this.

In an additional embodiment of the method, at least one overtone of the $7^{th}$ order or a higher order is attenuated by a value of less than 30 dB relative to the amplitude of the fundamental oscillation. Also here, the recognition that the higher overtones are not essential for the quality of the sinusoidal signal produced in the current loop can be utilized, and, technically exploiting this recognition, digital sine generators can be utilized, which require a fraction of the gates required by sine generators which also suppress harmonic waves greater than the $7^{th}$ order.

Regarding the electrical and/or electronic circuit, the object is achieved according to the invention by features including that a control unit is provided, which serves for producing a first data stream, wherein, in the first data stream, the direct current signal and alternating current signal to be set in the current loop are digitally encrypted, wherein a first transmission unit is provided, which serves to transmit the first data stream to an electrical current output circuit, and wherein the electrical current output circuit serves to convert the transmitted first data stream into an electrical current signal, wherein the electrical current signal is composed of the superimposed direct current signal and alternating current signal, or wherein the electrical current output circuit serves to convert the transmitted first data stream into the direct current signal and the alternating current signal.

With the aid of the control unit, a first data stream can be produced, in which the direct current signal to be set and an alternating current signal are digitally encrypted. The direct current signal can, in such case, correspond to a measured value recorded by, for example, a measuring transducer/sensor, and the alternating current signal to process relevant data, such as, for example, a status signal for maintenance or parametering. The alternating current signal is especially a signal modulated according to the HART protocol. For transmission of the data stream, the transmission unit is provided. The transmission unit can comprise a cable, wire or waveguide connection, or another kind of electrical and/or electromagnetic and especially optical connection. By the electrical current output circuit, the transmitted first data stream can be converted into the electrical current signal, which is composed of the superimposed direct current signal and alternating current signal. In such case, the electrical current signal can be set in the current loop. An advantage of the proposed circuit is, as already mentioned, that the direct current signal and alternating current signal to be set are digitally encrypted in a single data stream, namely the first data stream.

In an embodiment of the electrical and/or electronic circuit, from the control unit, at least one digital control signal is produced and/or output, which serves for producing the DC signal and the AC signal, especially for producing the first data stream. The control unit can output a control signal, wherein the control signal already contains the direct current signal and alternating current signal to be set in digitally encrypted form, and forms the first data stream. The construction of the proposed embodiment is especially simple, and can be implemented with few components.

In an additional embodiment of the electrical and/or electronic circuit, the control unit outputs at least a first digital control signal which serves for producing the DC signal, and furthermore outputs at least a second digital control signal which serves for producing the AC signal. In an embodiment of the electrical and/or electronic circuit, a first signal processing unit is provided, which serves to combine and/or to convert the first and the second digital control signal or signals derived therefrom into the first data stream. In this embodiment, the combining and/or transformation of the first and of the second control signal into the first data stream is assumed by the first signal processing unit. In this way, corresponding electrical and/or electronic standard components which are matchable to one another can be used for the particular requirements. The digital control signals can, for example, be combined by means of an adder, which, for example, is part of the signal processing unit.

In a further development of the circuit, a digital switching unit is provided, which serves for producing the first data stream, especially the AC signal to be set in the current loop, by means of a first control signal, especially a digital control signal, output by the control unit.

In an additional further development of the circuit, the control unit includes a digital communication interface—especially a serial digital communication interface—wherein the digital communication interface serves for transmission between the digital switching unit and the control unit of control signals representing the alternating current signal to be set.

In an additional further development of the circuit, the digital switching unit serves to produce from the control signals transmitted by the control unit via the digital communication interface at least one numerical value or a sequence of numerical values, wherein the numerical value or the sequence corresponds to the alternating current signal to be set in the current loop, wherein the numerical values are especially presented in a format with a bit width of n bits.

In an additional further development of the circuit, a register is provided, which is operable from the control unit, especially by means of a second, especially digital, control signal, and serves to output a numerical value corresponding to the direct current signal to be set, wherein the numerical value is presented in a format with a bit width of m bits.

In an additional embodiment of the electrical and/or electronic circuit, the first signal processing unit includes a digital delta-sigma modulator, which serves to produce the first data stream. The digital delta-sigma modulator converts a digital signal present on the input-side into a likewise digital signal on output-side. On the input-side, the digital delta-sigma modulator can be fed the at least one control signal or the combined first and second control signal. The output side output first data stream can, for example, be composed of a so-called bit stream. Alternatively, the use of another kind of digital-to-digital converter is also possible. The function of the signal processing unit can, for example, be integrated into the control unit, so that only the first data stream is output by the control unit.

In a form of embodiment of the circuit, the sigma delta-modulator (DM) is embodied in such a manner, that the sigma-delta modulator (DM) is operable in the first or second order as a function of an input value, which corresponds to or is derivable from the alternating current signal and direct current signal to be set in the current loop.

In an additional embodiment of the electrical and/or electronic circuit, a synchronizing unit is provided, which serves to synchronize the transmitted first data stream with a predetermined clock signal. The synchronizing unit can, for example, comprise a flip-flop, especially a D-flip-flop, and synchronize the first data stream transmitted to the electrical current output circuit with a predetermined clock signal. In this way, a signal basically freed of jitter is produced.

In an additional embodiment of the electrical and/or electronic circuit, the electrical current output circuit includes a first filter with a low-pass characteristic curve, wherein this filter processes the transmitted first data stream into an analog voltage. In order not to limit the frequency range of the AC signal, the limit frequency of the low-pass filter can be selected so as to be higher than the frequency of the AC signal to be set in the current loop. The frequency range of the AC signal is then not suppressed by the low-pass filter-rather, only noise which originates from frequencies which are greater than that of the AC signal is suppressed.

In an additional embodiment of the electrical and/or electronic circuit, the electrical current output circuit includes a voltage-to-current converter, which serves for conversion of the analog voltage into the direct current signal and the alternating current signal. By means of the voltage-to-current converter, the output signal output by the low-pass filter as a voltage signal can be converted into the electrical current signal to be set in the two-conductor current loop.

In an additional embodiment of the electrical and/or electronic circuit, electrical and/or electronic components of the electrical current output circuit are spatially surrounded by electrically conductive traces, wherein the conductive traces are actively held to essentially the same DC potential as the electrical and/or electronic components. Therewith, the outflow of leakage currents can effectively be prevented or lessened. Especially the electrical and/or electronic components of, for example, an RC network of the first filter can, in such case, be surrounded by electrically conductive traces, which are held to essentially the same DC potential as the components themselves, in order to avoid the outflow of leakage currents and to forward an uncorrupted voltage signal to the voltage-to-current converter.

In an additional embodiment of the electrical and/or electronic circuit, the current output circuit includes a second signal processing unit, which converts the direct current signal and/or alternating current signal set in the current loop into a second data stream, wherein the direct current signal and the alternating current signal are digitally encrypted in the second data stream.

In an additional embodiment of the electrical and/or electronic circuit, the second signal processing unit includes an analog delta-sigma modulator, which serves to produce the second data stream. The analog delta-sigma modulator can convert an analog signal present on the input side into a digital signal on the output side. Present on the input side of the analog delta-sigma modulator is then, for example, the electrical current signal set in the current loop, which is converted on the output side into a second data stream. Also here, some other analog-to-digital converter can alternatively be used instead of the analog delta-sigma modulator.

In an additional embodiment of the electrical and/or electronic circuit, a loop filter of the analog delta-sigma modulator used for the modulation is a time-continuous filter. In comparison, for example, to a time-discrete filter, the time-continuous filter has a greater signal/noise separation. Additionally, in the case of a time-discrete filter, no integrated circuit for switching of, for example, switched capacitor circuits is required.

In an additional embodiment of the electrical and/or electronic circuit, the loop filter used for the modulation is implemented by means of a single operational amplifier, wherein a pole of the transfer function is implemented via an RC unit. The time-continuous filter includes at least one RC unit, i.e. a system constructed from at least one resistor and at least one capacitor, which replaces, for example, an integrated circuit used in the case of a time-discrete filter for switching the capacitors. This simplifies the circuit and thereby lessens the manufacturing costs of the analog delta-sigma modulator. The pole points of such a transfer function decisively determine the transfer behavior for example of the first filter with a low-pass characteristic curve.

In an additional embodiment of the electrical and/or electronic circuit, a second transmission unit is provided, which serves to transmit the second data stream to the control unit. The second transmission unit can, in such case, comprise a signal- and/or data line like the first transmission unit, or, for example, be a unit for signal transmission across a galvanic barrier. The first and/or second transmission unit can especially be an optocoupler or a transformer.

In an additional embodiment of the electrical and/or electronic circuit, a second filter is provided, wherein the second filter separates the second data stream transmitted via the second transmission unit into a first signal corresponding to the direct current signal and a second signal corresponding to the alternating current signal. The second filter can especially be a decimation filter, and the first signal and the second signal can be digital signals. These first and second signals can be transmitted back to the control unit, for example, for monitoring purposes.

In an additional form of embodiment of the circuit, a decimation filter, especially a CIC filter, is provided, which serves to the change the sampling rate of the second data stream.

In an additional form of embodiment of the circuit, the decimation filter outputs a numerical value or a sequence of numerical values which represents the direct current signal and the alternating current signal set in the current loop.

In an additional form of embodiment of the circuit, a filter—especially a moving average filter—is provided, which separates from one another a first part of the numerical value and a second part of the numerical value which represent the direct current signal and the alternating current signal set in the current loop, wherein the first part corresponds to the alternating current signal set in the current loop, and wherein the second part corresponds to the direct current signal set in the current loop.

In an additional form of embodiment of the circuit, the register additionally serves to process the second part of the numerical value.

In an additional form of embodiment of the circuit, the first part is fed to a quadrature demodulator, which produces signals readable for the control unit, especially an RxD signal and a carrier detect signal.

In an additional form of embodiment of the circuit, the RxD signal and the carrier detect signal are deliverable via the digital communication interface UART of the control unit.

In an additional form of embodiment of the circuit, the alternating current signal set in the current loop is an essentially sinusoidal, alternating current signal, wherein the overtones of the sinusoidal AC signal up to and including the $6^{th}$ order are attenuated by a value of at least 30 dB relative to the amplitude of the fundamental oscillation of the sinusoidal AC signal. In an additional form of embodiment of the circuit, at least one overtone of the $7^{th}$ order or a higher order is attenuated by a value of less than 30 dB relative to the amplitude of the fundamental oscillation.

Another embodiment of the invention relates to a field device of process and/or automation technology with an electrical and/or electronic circuit in one of the aforementioned embodiments. Especially field devices which serve for registering and/or control of process variables communicate via a current loop with a second system, especially a superordinated unit. The circuit of the invention likewise enables a more reliable signal transmission across the galvanic barrier, as well as a simpler signal transmission via the current loop. Additionally, diagnosis of the field device electronics, i.e. the control unit and the electrical current output circuit, is facilitated.

BRIEF DESCRIPTION OF THE DRAWINGS

The invention will now be explained in greater detail based on the appended drawing, the figures of which show as follows.

DETAILED DISCUSSION IN CONJUNCTION WITH THE DRAWINGS

Figure 1:
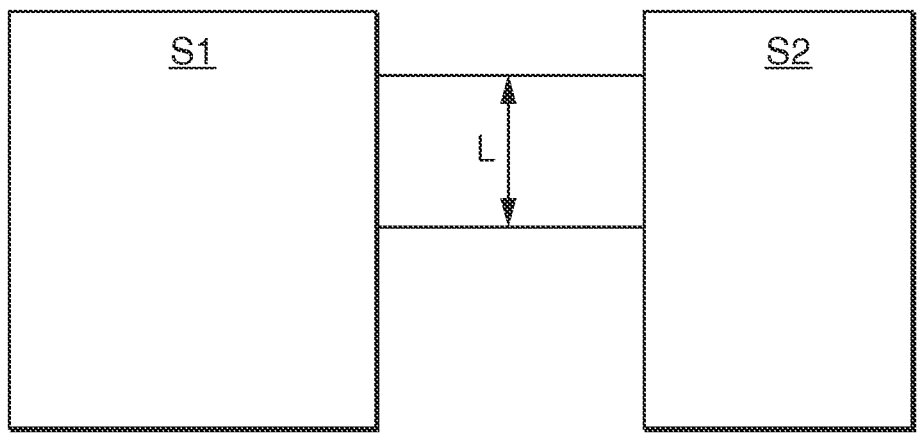
FIG. 1 is a schematic representation of a first system, which via a current loop is connected with a second system.

FIG. 1 shows a schematic representation of the first system S1 and of the second system S2, which are connected with one another via a current loop L, here a two-line cable. The first system S1 is, for example, a field device of process automation technology. The field device can especially be an actuator or a measuring transducer/sensor.

Via the current loop L, a measuring and/or control variable can be transmitted via a value of the DC signal of the electrical current set in the current loop L. Via the current loop L, an alternating current signal can also be transmitted—e.g. by means of the HART protocol—and can be utilized for the digital signal transmission. The second system S2 can be a superordinated unit, especially a process control station or a process control. A control unit CPU for producing a first data stream U1 which, contains the direct current signal and alternating current signal to be set, and an electrical current output circuit S for converting the first data stream U1 into the direct current signal and the alternating current signal can be integrated into the first system S1.

Figure 2:
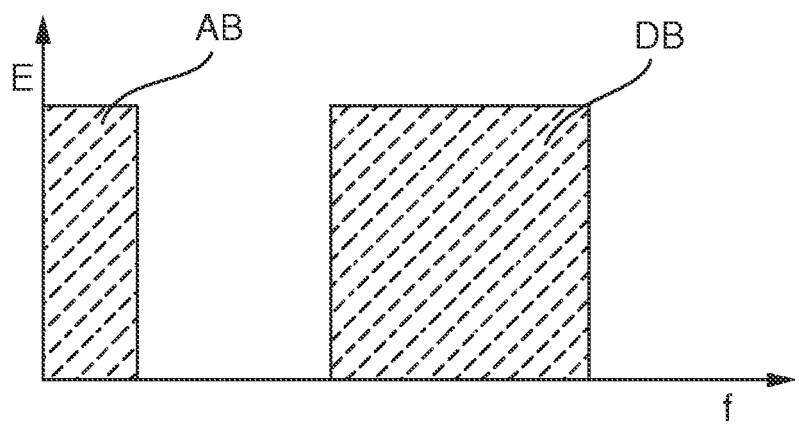
FIG. 2 is a schematic representation of the frequency spectrum of the electrical current signal settable in the current loop.

By way of example, FIG. 2 shows the frequency spectrum of the analog electrical current signal in the current loop L, transmitted according to the 4-20 mA standard and the HART protocol. The direct current signal and the alternating current signal are superimposed in the current loop L, and form the analog electrical current signal. The signal transmission occurs in two different frequency bands AB, DB. In order to implement this frequency-multiplexing, with respect to hardware, band-pass and/or low-pass filters, especially of a higher order, are thus required in order to separate the alternating current signal from the direct current signal. The direct current signal can, for example, be a 4-20 mA signal. Such a signal is especially of a low frequency (e.g. 0-30 Hz), and differs from the frequencies f of the AC signal used for digital transmission of above 100 Hz.

Figure 3:
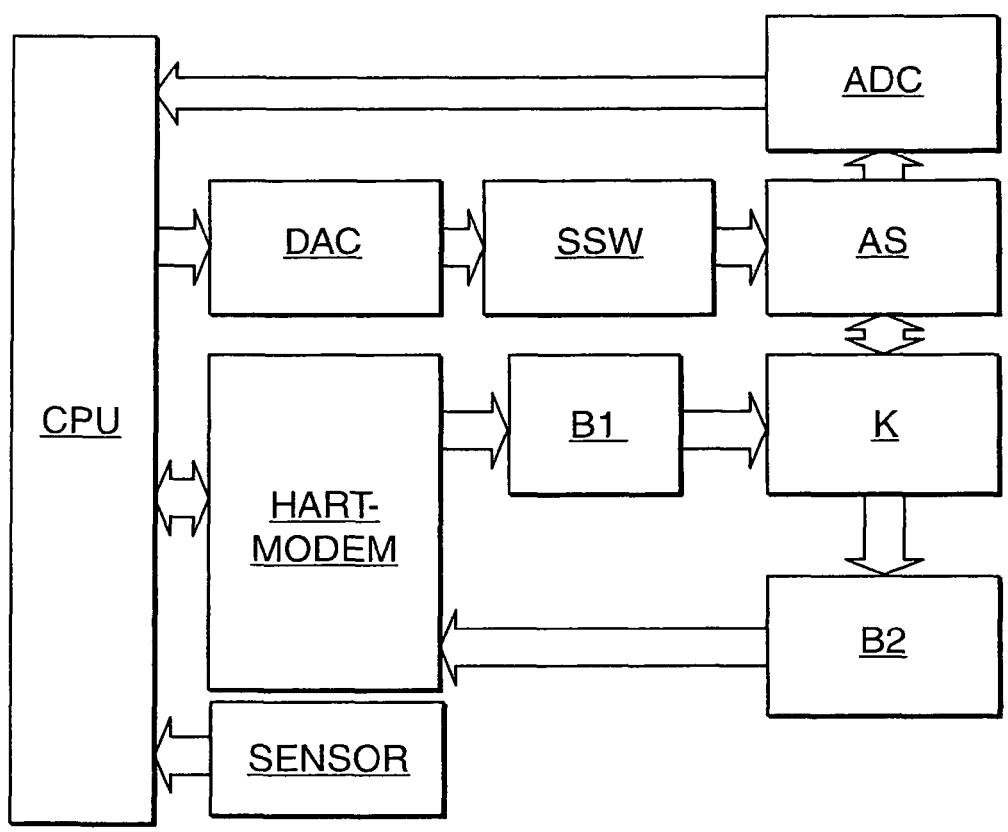
FIG. 3 is a schematic representation of the control unit and the electrical current output circuit.

FIG. 3 shows an equivalent circuit diagram of a control unit CPU and an electrical current output circuit S. The control unit CPU is, for example, connected with a sensor or an actuator, which can be controlled and/or read-out from the control unit CPU. The sensor produces, for example, an analog voltage corresponding to the measured variable. If the control unit CPU is, for example, connected with such a sensor, a measured variable recorded by the sensor is then converted by the control unit CPU into, for example, a digital value, which is in turn converted by means of a digital-to-analog converter DAC into an analog signal variable, the direct current signal. This signal variable is set in the current loop L, which is connected with the second system S2. From the connection SH of the current loop L, the analog electrical current signal present there is impressed upon an analog-to-digital converter ADC. This converts the analog signal into a digital signal, which can be read by the control unit CPU. In this way, by means of the control unit CPU, it can be checked whether the analog transmission channel functions properly up to the connection SH to the current loop L. For this, it suffices to compare the read-back actual value of the analog signal at the current loop L with the expected desired value. In the case of malfunction, suitable measures can be taken, e.g. by activating an alarm light or an alarm signal.

In order to be able to use, in addition to the analog signal, also the advantages of digital communication with the superordinated unit, the first system S1 contains the circuit parts sketched in FIG. 3: a HART modem and analog filter, such as, for example, the band-pass B1 and the band-pass B2. The control unit CPU transmits the signal level, for example, an asynchronous serial interface, to a digital circuit, the so-called HART modem. The HART modem generates an output signal, which is filtered in an analog manner by means of a first band-pass B1, in order to then be coupled to the current loop L. For communication in the opposing direction, an analog filtering of the signal level likewise occurs in the current loop L via a second band-pass B2. The result of this filtering is transmitted to a digital demodulation circuit— which, for example, can be part of the HART modem—and is converted into a signal for an asynchronous digital interface, which is connected to the control unit CPU. For this filtering, multistage active analog filters are required.

The current output circuit S shown in FIG. 3 thus essentially comprises the digital-to-analog converter DAC, the HART modem, a voltage-to-current converter VCC, an alternating electrical current coupling unit K, the connection SH to the current loop L, and an analog-to-digital converter ADC for function checking. Characteristic for the control unit CPU and electrical current output circuit S shown in FIG. 3 is that the individual circuit parts are connected with one another via a plurality of analog or digital lines. If a galvanic isolation for the connection SH to the current loop L, i.e. between electrical current output circuit S and control unit CPU, is required, either analog signals, or, alternatively, a large number of digital signals must then be transmitted across the galvanic barrier GB. The implementation of a galvanic isolation is thus associated with a high effort for the circuit and with high costs.

Figure 4:
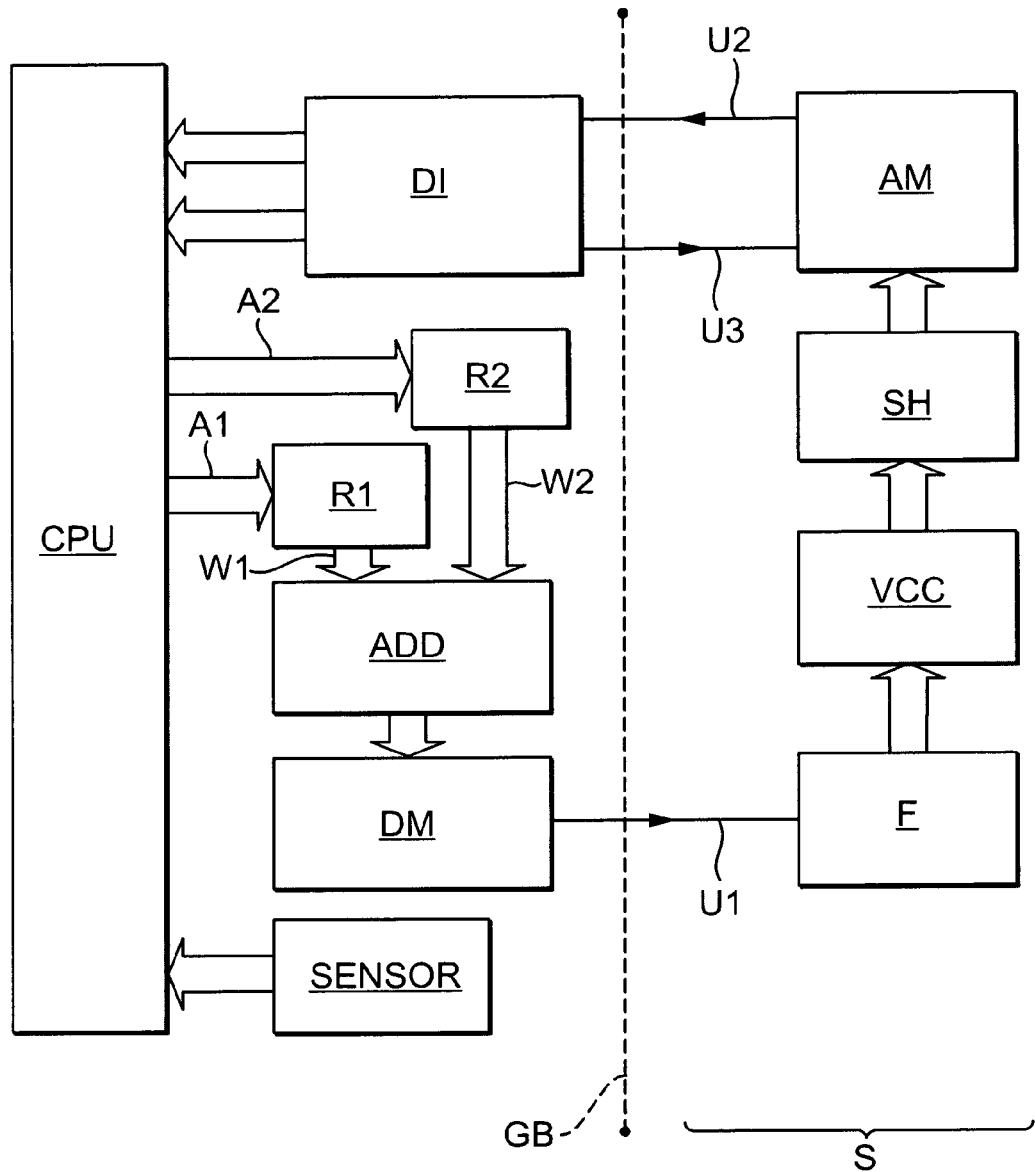
FIG. 4 is a schematic representation of a form of embodiment of a circuit of the invention.

FIG. 4 shows an embodiment of the electrical and/or electronic circuit of the invention, in the following also called "the circuit". The circuit can make use of a number of circuit portions, which assure different functionalities of the circuit. The circuit is divided into two portions, the primary circuit and the secondary circuit, which are galvanically isolated from one another. The galvanic isolation can be present between the control unit CPU and the current output circuit S, and is indicated in FIG. 4 by the dashed line. Via the galvanic isolation, the primary circuit, essentially composed of a sensor and control unit CPU, is separated from the secondary circuit, essentially composed of current output circuit S, current loop L and second system S2. A transmission of the first and second data stream U1, U2 can, for example, occur via only three digital exchange signals U1, U2, U3, and can, for example, be implemented by means of three transmission units (not shown). An essential advantage of the circuit is that exclusively digital components in the primary circuit are used for transmission of the first data stream U1. All analog components are located in the secondary circuit, which is galvanically isolated from the primary circuit and electrically insulated. Therewith, transmissions of disturbance signals, which can be caused e.g. by fast clockings of the control unit CPU, are suppressed in the analog circuit parts.

The first and the second data stream U1, U2 can be transmitted via two transmission units (not shown). The clock signal CLK present in the control unit CPU and the electrical current output circuit S can be transmitted via a third exchange signal U3 via a third transmission unit (not shown). Synchronously with the clock signal CLK (generated e.g. by the control unit CPU), a data stream U1, U2 is transmitted via each of the two transmission units. The use of a separate transmission unit for the clock signal CLK can be omitted, when so-called clock signal regeneration circuits (clock recovery) known from the state of the art are used, and the clock signal CLK is extracted from the respective data stream. The first data stream U1 transmitted in the direction of the current loop L is, for example, produced by a digital delta-sigma modulator DM, The digital delta-sigma modulator DM converts a digital signal present on the input side into a likewise digital signal—especially a bit stream—on the output side. For this, in a form of embodiment, a second order digital delta-sigma modulator DM can be used. In the first data stream U1 produced by the digital delta-sigma modulator DM, both the low frequency part of the DC signal to be set as well as also the higher frequency part of the AC signal to be set are digitally encrypted.

The first data stream U1 is transmitted over a galvanic barrier GB and conveyed to a first filter F with a low-pass characteristic curve. Advantageously, this first analog filter F is implemented exclusively through passive components. The omission of active components, e.g. semiconductor components, enables a high linearity of the first filter F to be assured in a simple manner. The omission of active components such as transistors or operational amplifiers for the first filter F simultaneously also reduces the manufacturing costs of the circuit.

The first data stream U1 is produced by means of a first and a second control signal A1, A2. The first and the second control signal A1, A2 are produced by the control unit CPU and output, wherein the first control signal A1 serves for producing the DC signal and the second control signal A2 serves for producing the AC signal. The first control signal A1 is transmitted to a first register R1, which outputs especially digital values W1 corresponding to the first control signal A1. The second control signal A2 is transmitted to a second register R2, which outputs especially digital values W2 corresponding to the second control signal A2. By means of an adder ADD, the values W1, W2 are combined and forwarded to the digital delta-sigma modulator DM. The first data stream U1 is then produced by digital delta-sigma modulator DM.

Figure 6:
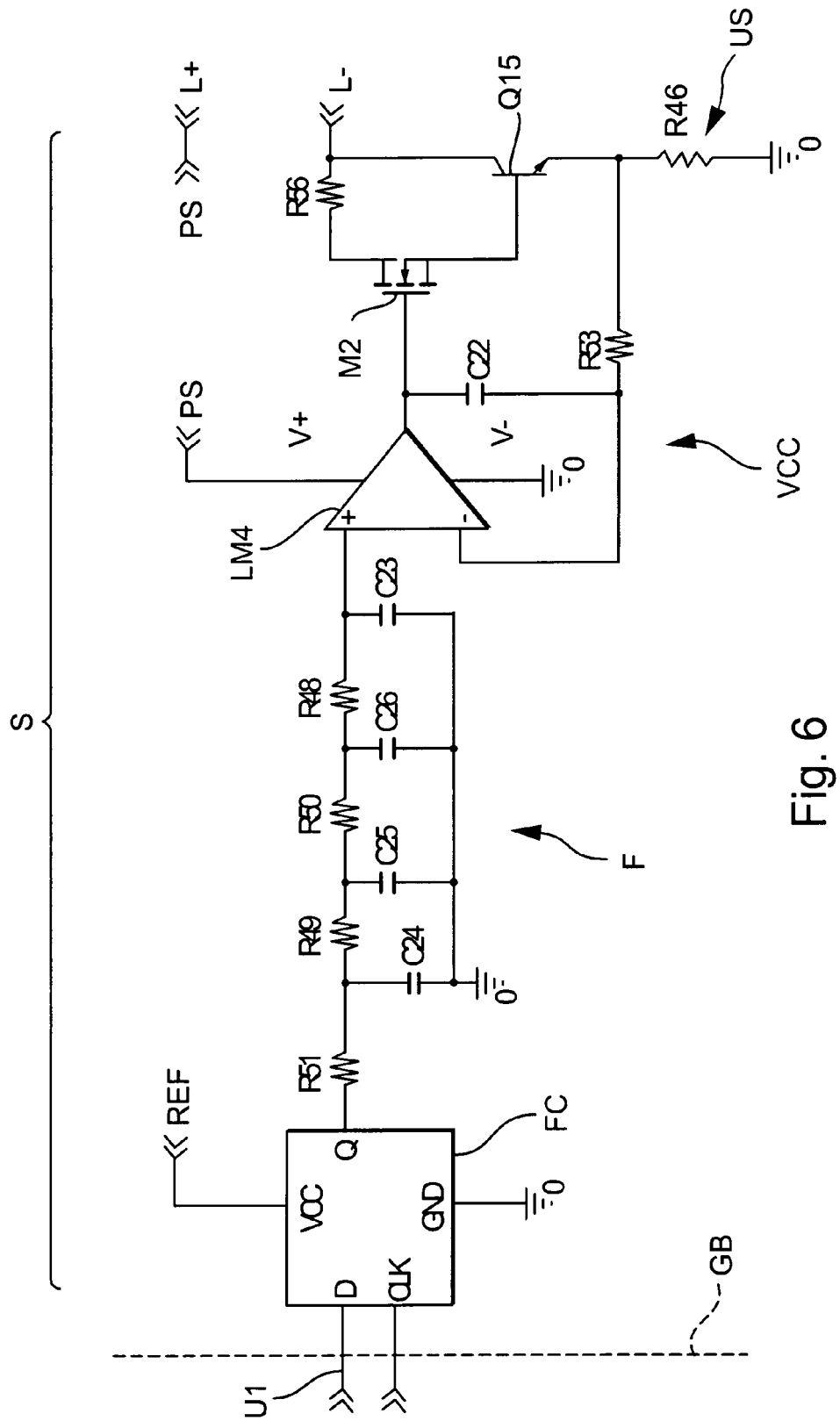
FIG. 6 is an equivalent circuit diagram of a first filter with a low-pass characteristic curve.

FIG. 6 shows an equivalent circuit diagram of a first filter F with a low-pass characteristic curve. The first filter F essentially composed of a cascade of RC networks. In FIG. 6, a first filter F is shown, which is composed of a 4-staged cascade. A first RC unit is composed, in such case, of the fifteenth resistor R51 and the first smoothing capacitor C24. A second RC-unit is composed, in such case, of the sixteenth resistor R49 and the second smoothing capacitor C25. A third RC-unit is composed, in such case, of the seventeenth resistor R50 and the first third smoothing capacitor C26. A fourth RC-unit is composed, in such case, of the eighteenth resistor R48 and the fourth smoothing capacitor C23. The first filter F outputs as a filtered output signal a voltage signal, which is delivered to a voltage-to-current converter VCC and is converted into an electrical current signal. The voltage-to-current converter VCC is implemented in FIG. 6 by means of an operational amplifier LM4, a field effect transistor M2 and a discrete transistor Q15. Operational amplifier LM4 and transistors Q15, M2 control the voltage drop at a shunt resistor R46 in such a manner, that the voltage accessed at the shunt resistor R46 corresponds exactly to the output voltage of the first filter F with a low-pass characteristic curve. This shunt voltage US accessed at the shunt resistor R46 is directly proportional to the electrical current signal set in the current loop L.

If both the low-frequency as well as also the higher-frequency signal component, i.e. the direct current signal and the alternating current signal to be set are encrypted in the first data stream U1, by means of the circuit shown in FIG. 6, both the "analog signal" comprising the direct current signal as well as also the "HART" signal comprising the alternating current signal are impressed on the current loop L. After smoothing the first data stream U1 in the first filter F with a low-pass characteristic curve, there occurs on the non-inverting input of the operational amplifier LM4 an analog voltage with a direct voltage component and an alternating voltage component. Via the field effect transistor M2 and the transistor Q15, a corresponding electrical current signal is then set in the current loop L. For such purpose, the electrical current output circuit S is connected to the electrically negative side L− of the current loop L. The electrically positive side L+ of current loop L is connected to the voltage supply PS. The operational amplifier LM4 of electrical current output circuit S is fed by the voltage supply PS.

The encryption of the DC signal to be set and of the AC signal to be set in the first data stream U1 can be implemented in that the input variable, from which the digital delta-sigma modulator DM the first data stream U1 is calculated, is formed by the sum of two different components, for example the first and the second control signal A1, A2 or signals W1, W2 derived therefrom: A low frequency component for the low frequency direct current signal to be set and a faster oscillating component for the alternating current signal to be set. The digital communication signals, which are utilized for digital communication with the second system S2, can be encrypted in the faster oscillating component.

The temporal progression of the switching edges of the first data stream U1—which, for example, is composed of a bit stream—is generally corrupted during transmission by the galvanic barrier GB. In FIG. 6, the galvanic barrier GB is indicated by the dashed line. A so-called "jitter" occurs. In order to prevent the influence of this jitter, the circuit from FIG. 6 first contains a flip-flop FC, here a D-flip-flop, which synchronizes the first data stream U1 to a clock signal CLK, which, for example, is available in both of the regions galvanically isolated from one another, the primary and the secondary circuits. For the function, it is, in such case, not relevant in which of the two regions galvanically isolated from one another the clock signal CLK is generated. The only decisive factor is that the signal processing occurs with the same clock signal CLK in both regions.

The flip-flop FC from FIG. 6 is operated with a precise reference voltage REF, which is present at the supply input VCC of flip-flop FC. This reference voltage REF enables the voltage present at the input of the operational amplifier LM4 to be precisely determined. If, for example, the first data stream U1 contains a bit pattern which 50% of the time runs at a high level and 50% of the time runs at a low level, at the output of the flip-flop FC, there then 50% of the time results a voltage of zero volts and 50% of the time the reference voltage REF. At the first filter F—a passive RC-filter—from FIG. 6, as an average over time, there therewith results exactly half the reference voltage REF. For the case in which the first transmission unit, which transmits the first data stream U1 across galvanic barrier GB, only causes a low signal corruption, also referred to as jitter, the use of a flip-flop FC can be omitted. In this case, the first data stream U1 can be connected from the first transmission unit directly with the input of the first filter F with a low-pass characteristic curve.

In order to enable a bidirectional signal transmission—and thus also communication—of the first system S1 with the second system S2, it is necessary that the control unit CPU from FIG. 4 receives information concerning the electrical current signal set in the current loop L, in which the second system S2—for example, a superordinated unit—encrypts its digital information to be transmitted. At the same time, for monitoring the function of the electrical current output circuit S from FIG. 4—which is mostly composed of analog components—it is necessary to forward information concerning the electrical current signal set in the current loop L to the control unit CPU. This electrical current signal is proportional to the shunt voltage US, which, for example, can be accessed at the shunt resistor R46 shown in FIG. 6. The transmission of the information to the control unit CPU can, for example, be implemented via an analog delta-sigma modulator AM, such as is shown, for example, in FIG. 8.

The data stream output by the analog delta-sigma modulator AM—for example, likewise a bit stream—can be used as the second data stream U2, which is transmitted across the galvanic barrier GB in the direction of control unit CPU. This second data stream U2 is generated synchronously with a clock signal CLK—which is, for example, produced by the control unit CPU—and can be transmitted to the analog delta-sigma modulator AM in FIG. 8. The dashed line in FIG. 8 symbolizes the galvanic barrier GB.

In the second data stream U2, two signal components are encrypted, which are fed to the analog delta-sigma modulator AM on the input side. This involves, on the one hand, a shunt voltage US, which is proportional to the electrical current which flows in the current loop L. On the other hand, it involves a voltage signal, which corresponds to the alternating current signal in the current loop L. For this purpose, the voltage signal is delivered to a passive analog high-pass filter, and, decoupled from the alternating current, is impressed on the delta-sigma modulator. This is achieved by means of an interposed eleventh capacitor C21, which serves to filter out direct voltage fractions. In an advantageous embodiment, this high-pass filter is supplemented with a circuit stage with a frequency characteristic curve, which, for example, suppresses grid frequencies of 50 or 60 Hz and thus lessens disturbance levels.

Such an analog delta-sigma modulator AM can, in contrast to the analog delta-sigma modulators AM known from the state of the art, be constructed with smaller components costs, since no integrated circuits are used In contrast to the circuits known from the state of the art, in addition the receipt of digital data from the superordinated unit, the proposed analog delta-sigma modulator AM also enables the reading back of the electrical current flowing within the current loop L, and therewith the monitoring of the first filter F.

The components of an analog delta-sigma modulator AM are formed from the following three circuit elements: first of all, from a digital register R (in FIG. 8 implemented via flip-flop FC), which synchronizes the output signal of a comparator LM3 to a clock signal CLK. Third, a so-called loop filter combines both the analog input signals of the analog delta-sigma modulator AM as well as also the output signal of the register R with the input of the comparator LM3. In connection with FIG. 8, "loop filter" refers to those components, which in an analog control loop connects the output of the register R (signal modulator out) in the form of a so-called "control loop" with the input of the comparator LM3.

The frequency characteristic curve of this loop filter determines the frequency characteristic curve of the digitizing noise, and therewith the resolution of the analog delta-sigma modulator AM. The higher the order of this low-pass, the more effectively the quantization noise can be suppressed. However, as regards the dynamic behavior and as regards the stability of the control loop of the analog delta-sigma modulator AM, a too high filter order is disadvantageous. The loop filter from FIG. 8 therewith includes a filter characteristic curve of the second order, wherein the first order of the filter or the first pole of the associated transfer function is formed by the integrator circuit (tenth resistor R25, eighth capacitor C4, operational amplifier LM2) and the second order or the second pole of the transfer function is formed by the RC-filter comprising the seventh resistor R23 and the sixth capacitor C27.

Figure 8:
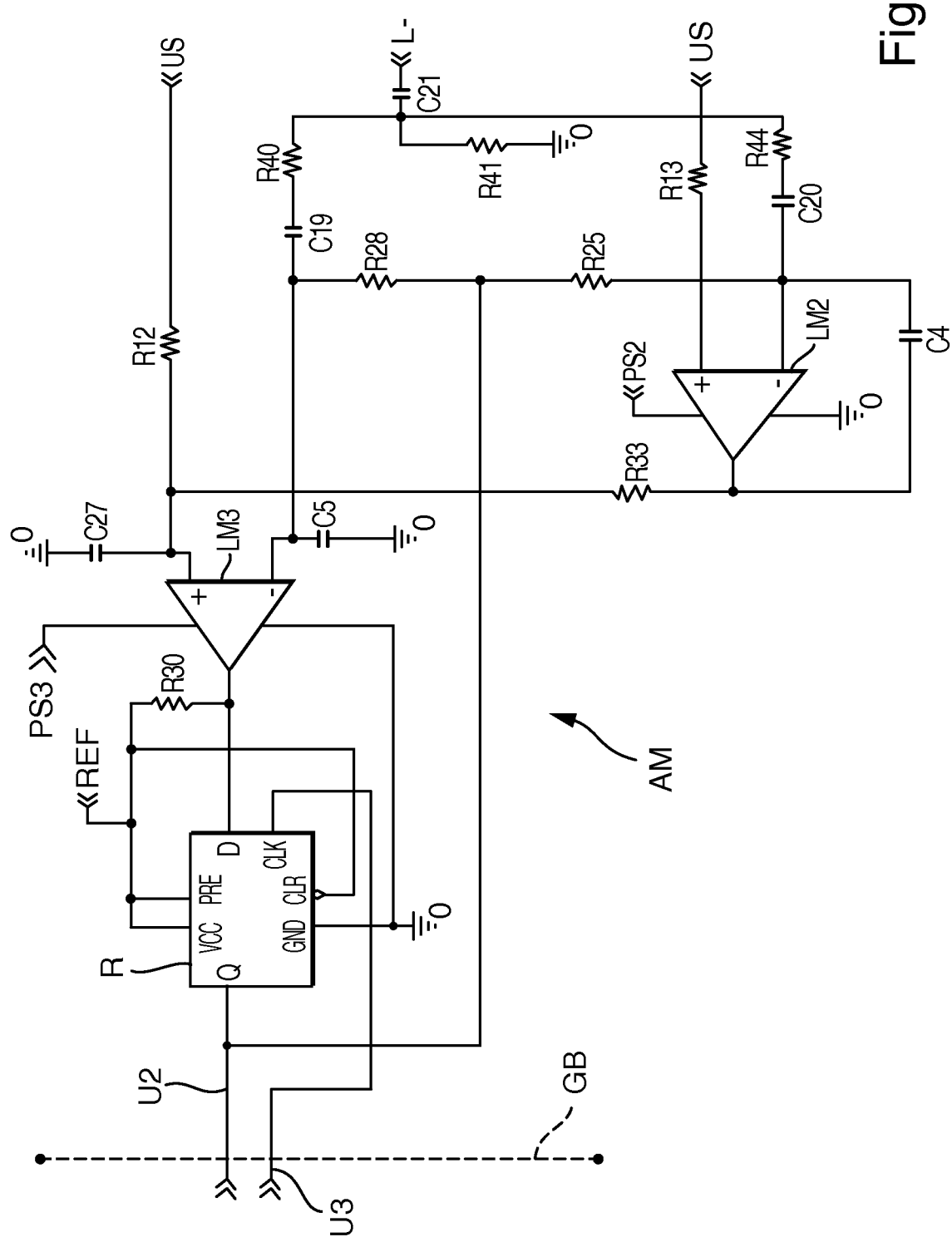
FIG. 8 is an equivalent circuit diagram of an analog delta-sigma modulator.

The loop filter of the analog delta-sigma modulator AM in FIG. 8 is implemented via a so-called time-continuous filter. This enables the possibility of working with especially favorably priced operational amplifiers LM2, LM3, with smaller bandwidth and smaller power consumption. Analog delta-sigma modulators AM known from the state of the art usually work with so-called time-discrete loop filters (switched capacitor filters) which, however, can only be implemented with difficulty—and therewith expensively—without the development of a specialized integrated circuit. Another special feature is that the loop filter shown in FIG. 8 implements a second order filter characteristic curve, but, however, only requires an operational amplifier LM2 therefor.

Another special feature is that the analog delta-sigma modulator AM from FIG. 8 has two separate input paths available, which, independently from one another, couple a direct voltage and an alternating voltage component to the loop filter. With respect to the dimensioning of the working clock speed of the analog delta-sigma modulator AM, the following considerations are meaningful. In order to make due with favorably priced circuit components, e.g. with operational amplifiers with a small amplification bandwidth product (gain bandwidth product) of e.g. 1 MHz, in the case of the (data) clock signal CLK, it is advantageous to impose limits of below 3 MHz on limit frequencies below. On the other hand, a sufficient so-called oversampling rate is required in order to assure that the greatest desired wanted frequency of the analog delta-sigma modulator AM is transmitted with sufficiently low corruption. If one works, purposefully e.g. with an oversampling rate of at least 64 and a wanted frequency of max. 5 kHz, there then results a reasonable minimum value for the clock signal CLK of around 300 kHz. A frequency between 200 kHz and 4 MHz is thus advantageously used for the clock signal CLK. If the modulator should only be used for reading back the DC signal, smaller clock frequencies also come into consideration, e.g. frequencies of 64*30 Hz=2 kHz.

Both the direct current signal as well as also the alternating current signal can be found digitally encrypted in the second data stream U2 accessible at the output of the register R, wherein the second data stream U2 can be forwarded beyond the galvanic barrier GB to the control unit CPU and/or evaluation unit. In a digital decimation filter DI, the part of the second data stream U2 corresponding to the direct current signal and the part corresponding to the alternating current signal can, in turn, be separated from one another and be forwarded to the control unit CPU. Then, by means of digital signal processing, from the part of the second data stream U2 corresponding to the alternating current signal, the digital data can be extracted, which, for example, the superordinated unit has set in the current loop L. An evaluation therewith enables receipt of digital data on the part of the control unit CPU. It is of advantage that the encryption of direct current signals and alternating current signals is possible on an individual digital line by means of delta-sigma modulators, and the producing of data streams U1, U2 is achieved without a large hardware effort. A digital delta-sigma modulator DM can, for example, be implemented with only little logic resources in an integrated circuit within a so-called field programmable gate array FPGA or a so-called complex programmable logic device CPLD. An analog delta-sigma modulator AM can also be simply constructed with a small number electronic components. In the minimum case, only an operational amplifier LM2 and a comparator LM3 are required. The number of electronic components is therewith far smaller than in the case of conventional solutions used in the state of the art. This is associated with an increased robustness and smaller component costs. A further advantage of the circuit of the invention is that the number of circuit components which are required for producing and monitoring the analog 4-20 mA signals is very small.

The circuit actually designed as the current output S with the read-back circuit of the invention can especially also be utilized as an "electrical current input" without extra costs. For such purpose, an operating mode of the first the control unit CPU and the electrical current output circuit S can be provided. In the case of use of the circuit shown in FIG. 4 as an "electrical current input", the first system S1 is connected via a current loop L with a second system S2, wherein the second system S2 can limit the electrical current flowing within the current loop L to an actuating value, for example by means of an electrical current source or another provided unit. If the electrical current of the voltage-to-current converter VCC from FIG. 4 is set to a maximal value, the electrical current flowing within the current loop L is not then limited by the control unit CPU and the current output circuit S, but instead rather limited by the electrical current source or the unit of the second system S2 provided therefor to the actuating value. The read-back channel from FIG. 8 in this case delivers back the electrical current effectively flowing within the current loop L. The combined circuit composed of control unit CPU and current output circuit S works, in this case, as an "electrical current input". For the accuracy of the DC signal generated during operation as current output S, besides the accuracy of the reference voltage REF with which the flip-flop FC is operated, the accuracy of the shunt resistor R46 and the accuracy of the first filter F are decisive.

Since, in the case of shunt resistors, an accuracy of few ppm cannot be assured even for precision resistors under series conditions, in practice, an adjusting of the circuit is required for generating the DC signals and AC signals. For the process times required during manufacturing, the settling time of the circuit is decisive for the time taken for alignment. In the example of an embodiment in FIG. 6, this settling time is first and foremost predetermined by the frequency characteristic curve of the analog first filter F, comprising the RC filter cascade. An essential advantage, of the circuit of the invention is that, in the case of use of a digital delta-sigma modulator DM for generating the first data stream U1, a first filter F with an especially high limit frequency can be used. Advantageously, this limit frequency is selected in the order of magnitude of the maximal frequency of the alternating current component which is utilized for the digital data encoding. In the case of the HART protocol, for example, this is above about 2.2 kHz (baud rate 1200 BPS) or about 6 kHz (baud rate 4.8 BPS). Through application of this high limit frequency, there automatically results an especially low settling time. This short settling time enables, for example, the adjusting of an electronics component within an especially short test time.

In a form of embodiment, the circuit of the invention has available a non-volatile memory, for example in the form of a so-called EEPROM or FLASH memory. After performing the alignment measuring, correction values can be ascertained and stored in the memory, these correction values enabling the calculational compensation of the tolerances of the shunt resistor R46, and thus a high accuracy of the electrical current signal in the current loop L. In the same manner, tolerances of the used reference voltage REF, and a so-called offset voltage of the operational amplifier LM4 from FIG. 6 and FIG. 7 in given cases forming can also be ascertained and compensated.

Since, for the accuracy of the electrical current signal flowing within the current loop L, the voltage present at the non-inverting input of the operational amplifier LM4 from FIG. 6 is decisive, it is required in given cases to take flowing leakage currents into consideration. If, for example, there flows over the second smoothing capacitor C25 from FIG. 6 a parasitic direct current, e.g. because of moisture films on the component, this direct current then leads to a voltage drop at the second RC unit. Analogous considerations hold for all components of the first filter F with a low-pass characteristic curve shown in FIG. 6. A leakage current drain which forms between one of the resistor connections of the first filter F and a component located in the vicinity or a conductive trace located in the vicinity leads to such a corruption of the DC potential. Decisive for the effect of a leakage current drain on the accuracy of the construction is the DC impedance of the circuit node. Only in the case of a high impedance does a significant voltage drop result from leakage currents.

Figure 7:
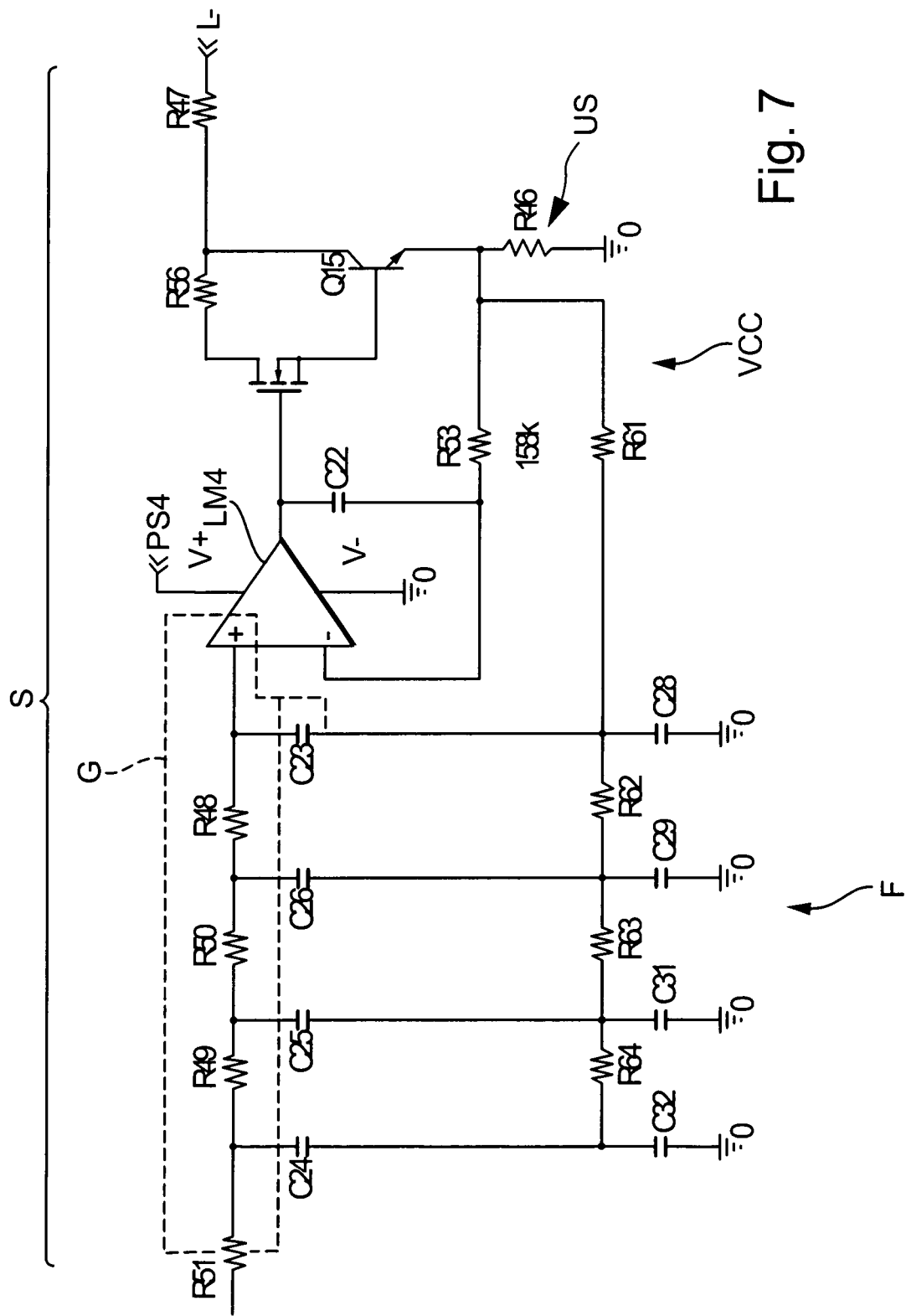
FIG. 7 is an equivalent circuit diagram of an additional first filter with a low-pass characteristic curve.

In FIG. 6, this thus especially affects the circuit nodes of the first filter F, which cannot be embodied in as low-ohm a form as desired, because otherwise, the output impedance of the driver gate—in FIG. 7 the D-flip-flop—is not small enough. Consequently, in an advantageous form of embodiment, the first filter F is covered with an insulating protective lacquer. The application of a protective lacquering means an additional process step for the product manufacturing, which causes material and work costs.

In an advantageous form of embodiment of the invention, the forming of parasitic leakage currents of the above described type are suppressed in other ways. For this purpose, the first, second, third and fourth smoothing capacitors C24, C25, C26, C23 are no longer conductively connected with a ground potential, but instead with a shielding signal which has approximately the same DC potential as is present at the non-inverting input of operational amplifier LM4, but with respect to higher frequencies, is, however, connected in a low-impedance manner with the ground potential. Advantageously, the signal path of the first, second, third and fourth RC networks of the first filter F is moreover actively shielded by means of a conductor loop, i.e. surrounded by a so-called guard ring G, wherein this guard ring G likewise is connected with such a shielding signal. This guard ring G is advantageously not covered on the circuit board of the assembly of the invention with insulating protective lacquer, i.e. it is free of insulating protective lacquer. Through application of the guard ring G and of the shield potential on the first, second, third and fourth smoothing capacitor, it is assured that in the environment of the high-resistance circuit nodes of the first filter F, the forming of a DC component which could flow between this node and another potential is suppressed. A possible implementing of a shield potential is presented in FIG. 7. The shield potential is in this case generated by a voltage being utilized, which carries the same AC potential as the non-inverting input of the operational amplifier LM4. In contrast to the input of operational amplifier LM4, this applied voltage, is, however, essentially low impedance.

The first filter F from FIG. 7 can have a limit frequency which enables transmission of the alternating current signal frequency ranges used for the digital communication with the second system S2. On the other hand, the limit frequency should be sufficiently low to sufficiently suppress high-frequency signal noise in given cases contained in the first data stream U1. If the first data stream U1 is, for example, a bit stream, and a frequency F for example of 500 kHz to 1 MHz is used as the bit rate of the bit stream, the limit frequency of the first filter F with a low-pass characteristic curve should then be lower than the data rate of the bit stream by a sufficient so-called "oversampling rate" of e.g. 128 to 256.

Figure 5:
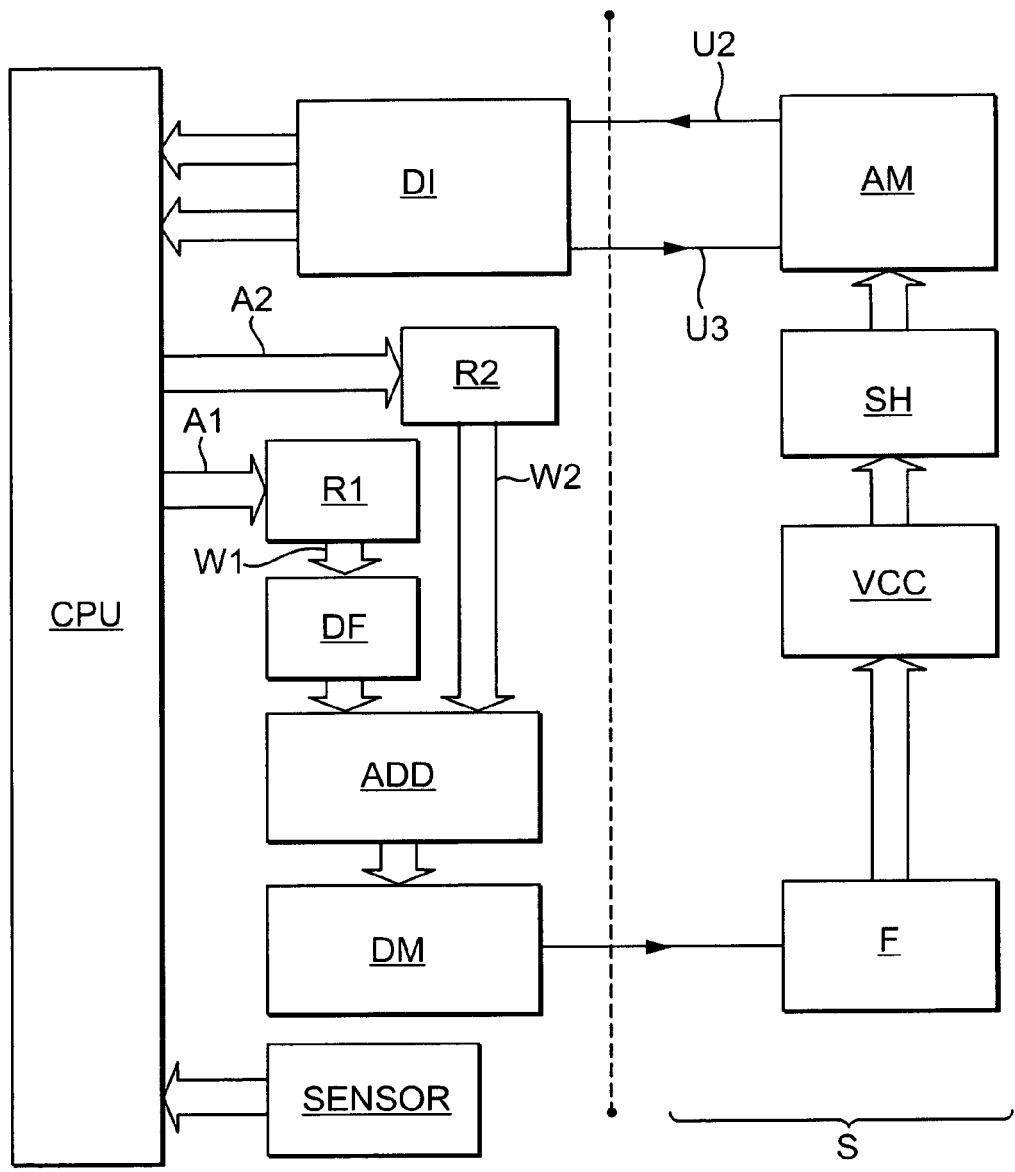
FIG. 5 is a schematic representation of an additional form of embodiment of a circuit of the invention.

Generally, however, a so-called "flat" transfer characteristic, that is a transfer characteristic which transmits in the relevant frequency band signals independently of the frequency with equal amplitude, can only be implemented by means of passive RC-members with difficulty. In the case of a filter with a low-pass characteristic curve, higher signal frequencies are generally more strongly attenuated than lower signal frequencies. This can lead to the fact that the electrical current signals of a higher frequency—e.g. 2200 Hz—to be transmitted to the second system S2, are more strongly attenuated than the signal components of a lesser frequency, e.g. 1200 Hz. This problem can be removed in that in the place of a passive RC-member, an active filter is made use of. This would, however, result in higher costs and in a potential non-linearity. Alternatively, an option is to eliminate the distortion in another manner. For this purpose, a digital filter DF can be added, which approximately compensates for the distortion in the first filter F with a low-pass characteristic curve. The digital filter DF can be positioned on different locations in the signal path. A possible position is shown in FIG. 5.

In an advantageous form of embodiment, the calculating of the sum of the control signals, or of the first and of the second control signal as well as the control signals themselves, or of the first and second control signals is performed in a digital circuit, for example within a so-called gate array, structured ASIC or within a so-called FPGA or CPLD.

Figure 9:
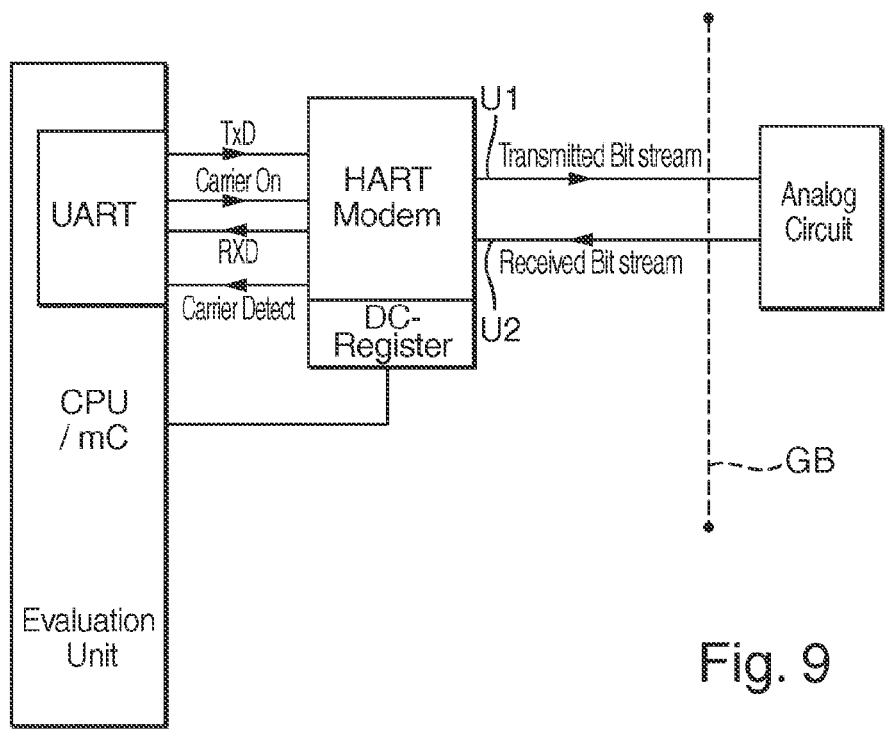
FIG. 9 is a schematic representation of a circuit of the invention and of the signal response in the case of signal transmission between a primary and a secondary circuit, which are isolated from one another by a galvanic barrier.

FIG. 9 shows a schematic representation of an embodiment of the proposed circuit and the signal response in the case of signal transmission between the first and the second system, or the primary and the secondary circuit. The illustrated control unit CPU can be a computer unit or a microprocessor. The control unit can be part of an evaluating circuit, which serves, for example, for generating measured values, measurement signals or for their processing. A measuring transducer/sensor (not shown) can serve for recording the measuring signals. The control unit includes a UART interface for digital communication with a part of the circuit referred to as the transmitting part. The transmitting part is composed, in such case, of a digital switching unit, which serves for producing the AC signal to be set and the HART signal, respectively, and of a register, which serves for producing the DC signal to be set. Furthermore, an adder and a digital delta-sigma modulator can be part of the transmission part. For transmission of a first control signal between the control unit and the transmitting part, the data lines TxD, RxD, Carrier On CO and carrier detect CD of the DART interface are used, the corresponding signals being transmitted via these data lines. In FIG. 9, the alternating current signal corresponding to the HART signal to be set is produced in the first data stream via the signals TxD, RxD, Carrier On CO and carrier detect CD. By means of the DC register likewise associated with the transmitting part, the part corresponding to the direct current signal is produced in the first data stream. For such purpose, the control unit can be connected via a signal line with the DC register. The analog circuit and digital part can, in such case, be separated as shown in FIG. 9 via a galvanic barrier GB. Via this barrier GB, only the first data stream D1 and the second data stream D2 are here transmitted.

Figure 10:
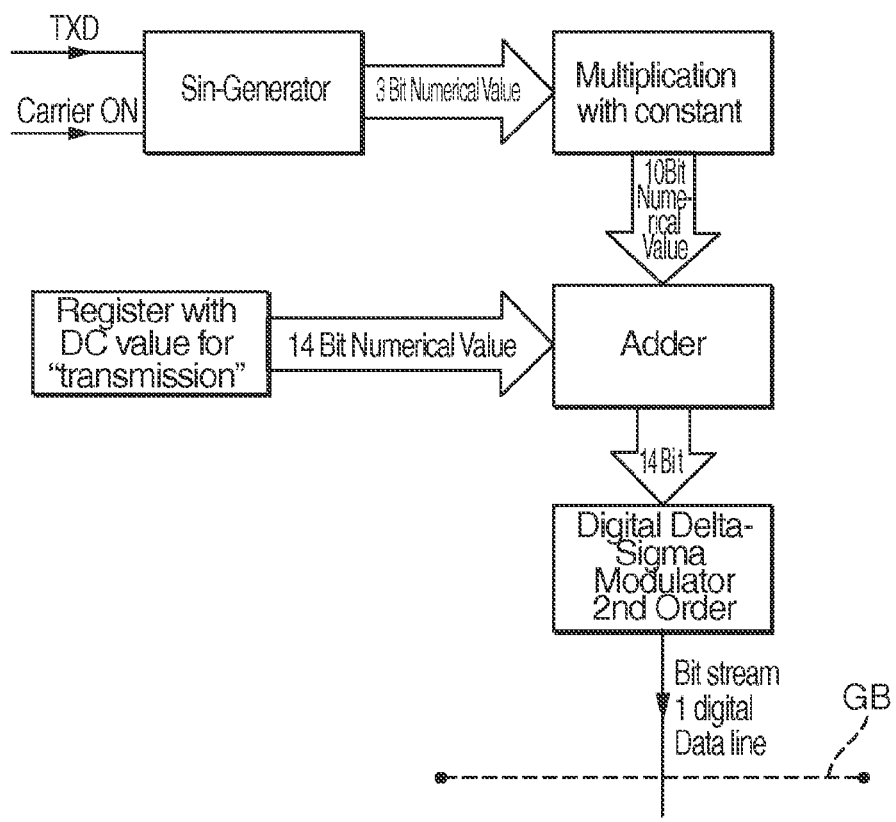
FIG. 10 is a schematic representation of a transmission part of the circuit.

FIG. 10 shows a schematic representation of the transmission part the circuit. The TxD signal line and the Carrier On signal are fed to a digital switching unit. The digital switching unit is also referred to as a sine generator, since it produces from the first TxD and the Carrier On signal numerical values, which approximate a sine oscillation. The sine generator thus produces an n-bit numerical value from the first control signal, wherein the first control signal here is composed of the TxD and the Carrier On. This numerical value is multiplied with a constant and fed to an adder, which adds the 3-bit numerical value corresponding to the alternating current signal to be set to the 14 bit numerical value from the register for the DC fraction. In such case, the 3-bit numerical value is scaled. The resulting 14 bit signal is fed to a digital delta-sigma modulator, which produces therefrom the first data stream, here a 1 bit stream. The digital delta-sigma modulator can, in such case, be operated in the 1st or 2nd order. The sine generator is distinguished in that it produces a low overtone amplitude with little hardware complexity, such as, for example, logic gates.

The two circuit blocks shown in FIG. 10 are thus composed of a sine generator and a multiplication or scaling unit, which, based on a TXD and a Carrier On signal, generates a time-variable 10 bit numerical value. The HART communications standard requires that, depending on the signal level of the TXD line, the alternating voltage signal impressed onto the current loop must correspond to either a 1200 Hz (TXD logic 1) sine or a 2200 Hz sine (TXD logic 0). The HART standard establishes in such case strict requirements for the quality of the sinusoidal signal. Furthermore, the HART standard establishes limit values for the amplitude of the AC signal, and a nominal amplitude of +/−0.5 mA. In the shown embodiment, the electrical current value to be transmitted is present as an input value with a DC and an AC component of the alternating electrical current signal or direct current signal to be set at the input of a digital sigma-delta converter, which converts the input value which is variable in time into in a bit stream. There is, in such case, a linear relationship between the input value existing at the input of the sigma-delta modulator, which, for example, is present as digital numerical value, and the electrical current value set in the current loop. The multiplication unit assures, in such case, that the starting value of the sine generator is scaled in such a manner, that the amplitude encodes an electrical current value of +/−0.5 mA. In principle, a digital sine value can be generated in different ways, for example, by tabulation of a large number of values which approximate a sine with high accuracy. For implementation in digital logic, such a tabulation means a higher circuit complexity, the higher the requirements for the accuracy the sine curve are. In that, depending on need, it is operated in the first or second order, the delta-sigma modulator can cover the control range from the minimum up to the maximum of the numerical value range.

Figure 11:
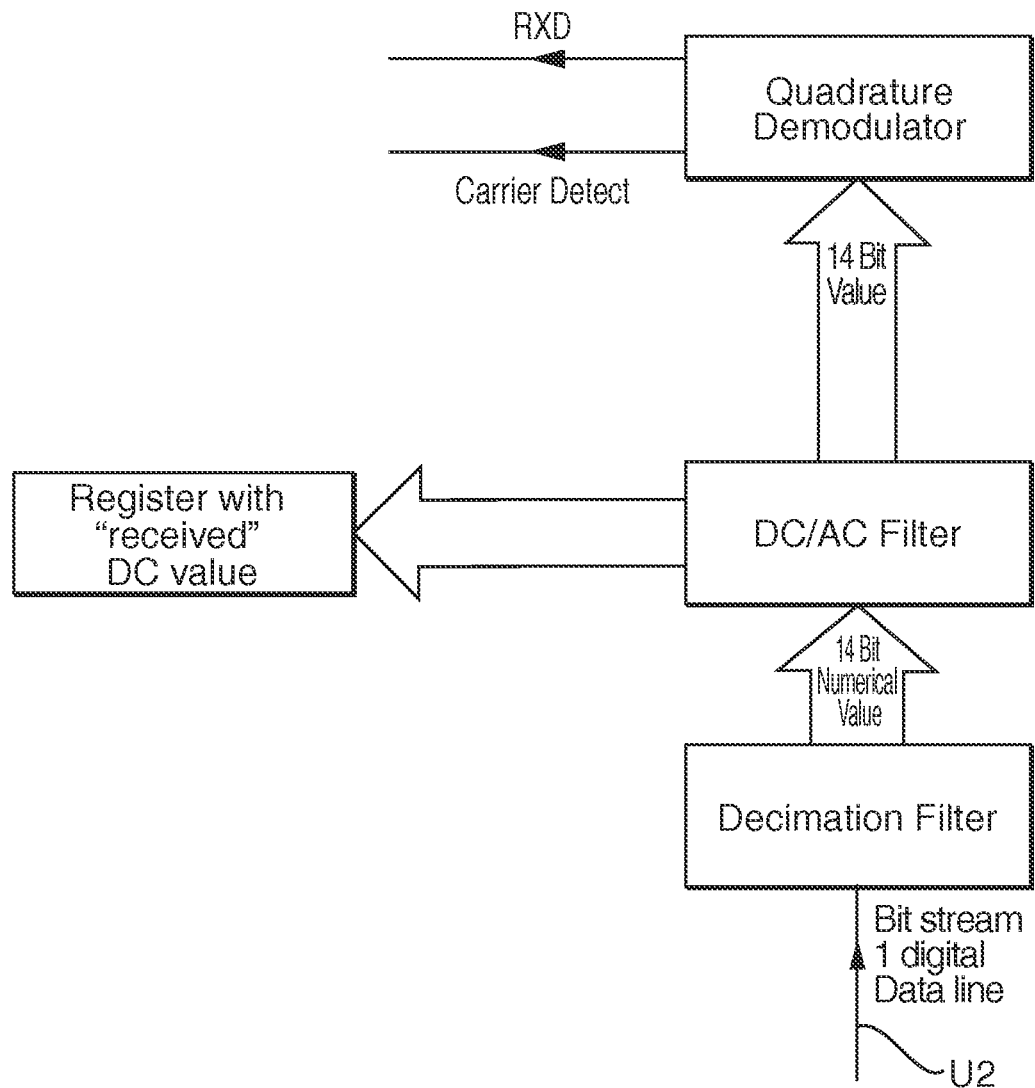
FIG. 11 is a schematic representation of a receiving part of the circuit.

FIG. 11 shows a schematic representation of the receiving part the proposed circuit. The receiving part can be part of the first system and belong to the primary circuit, i.e. it is, like the transmitting part, galvanically isolated from the electrical current output circuit. The second data stream U2, here a bit stream, which is derived from the electrical current signal set in the current loop L, passes through a decimation filter, which outputs a first numerical value, here with a bit width of 14 bits. This numerical value is fed to a filter, which separates the DC fraction from the AC fraction, which is contained in the first numerical value. The DC fraction is, for example, transmitted to a register as a second numerical value with a second bit width. A third numerical value, which is derived from the first numerical value and which includes the AC fraction of the electrical current signal set in the current loop and has a third bit width, is forwarded to a so-called quadrature demodulator, which produces the RxD and the carrier detect signal for the control unit. The third bit width of the third numerical value amounts in the shown example of an embodiment to 14 bits. By means of the quadrature demodulator, an RxD and a carrier detect signal are made available to the control unit.

Figure 12:
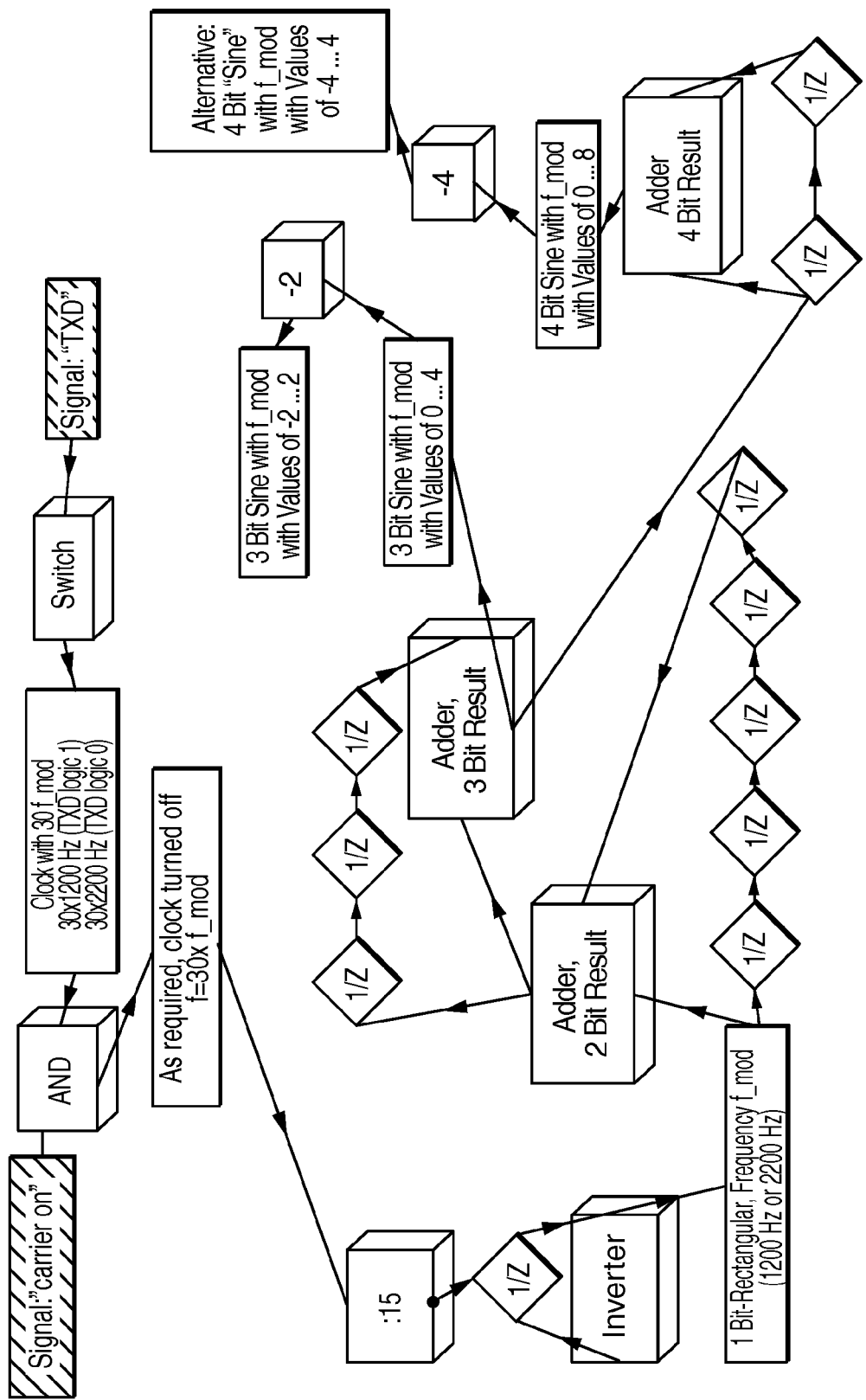
FIG. 12 is a flow diagram of a method for producing an essentially sinusoidal AC signal by means of a digital switching unit.

FIG. 12 shows a flow diagram of a circuit, which enables the circuit complexity for generating a sine curve—i.e. for generating a sinusoidal signal—to be drastically reduced, and, in spite of this, enables the high requirements of the HART specification for the quality the sine curve to be fulfilled. The basic idea is to define a switch network, which purposely does not generate an ideal sine, but, instead rather tolerates that the temporal progression of the numerical values contains harmonic waves of the $7^{th}$ order and higher orders of the sinusoidal oscillation to be generated, but the harmonic waves up to and including to the 5th order, however, essentially completely disappear. In that the higher harmonic waves are purposely tolerated, a switch network can be generated, which makes due with a fraction of the digital logic required for an alternative implementing on the basis of a tabulation. Therewith, a method can especially be generated, which, with a bit width of only 3 bits, achieves an accuracy of the sine curve for alternating current signal corresponding to the HART specification. In such case, use is made of the fact that in the analog circuit portion, which further processes the bit stream of the sigma-delta converter, a low-pass filtering of a very high order is performed. This low-pass filtering leads to the fact that, in given cases, 6th or $7^{th}$ order harmonic waves still present are removed. For the quality of the sinusoidal signal generated on the digital side, the amplitude of the higher harmonic waves thereby has no influence on the signal form of the signal present at the current loop.

FIG. 12 thus shows a flow diagram of a method for producing an essentially sinusoidal AC signal filtered as regards at least one part of the overtones. The method can, for example, be performed by means of the already mentioned digital switching unit. The control unit produces the Carrier On and TxD signals and sends these out. The TxD signal can, for example, be multiplied with 30 times the intended modulation frequency of the HART signal, i.e. 1200 or 2200 Hz. This can occur as a function of a logical value of the TxD signal. In this way, high, or low bits with a frequency of 30*1.2 Hz, or 30*2.2 kHz are produced. Thereby, a sequence of high or low bits with a frequency of f=30*1.2 kHz, or 30*2.2 kHz can especially be produced. By division and time delay of these high or low bits, a 1-bit rectangle function with a modulation frequency of 1200 or 2200 Hz can be produced. The 1-bit rectangular signal is, for example, time delayed with the clock signal f (corresponding to the 1/Z-stage in FIG. 12) by means of a register, and, with the original 1-bit rectangular signal, fed to an adder, which produces from the two 1 bit input signals a 2-bit output signal. The 2-bit signal thus produced is likewise delayed, and, with the undelayed 2 bit signal, in turn fed to an adder, which outputs a 3 bit output signal. This 3 bit output signal can then assume four values.

Alternatively, by the method shown, via, for example, another delay loop and an adder, a 4 bit numerical value can also be produced. In general, however, numerical values of any format, i.e. with a bit width of n bits, wherein n is a natural number, can be produced. The time delay and addition in such case implements a digital filtering of the rectangular signal present on the input side.

Figure 13:
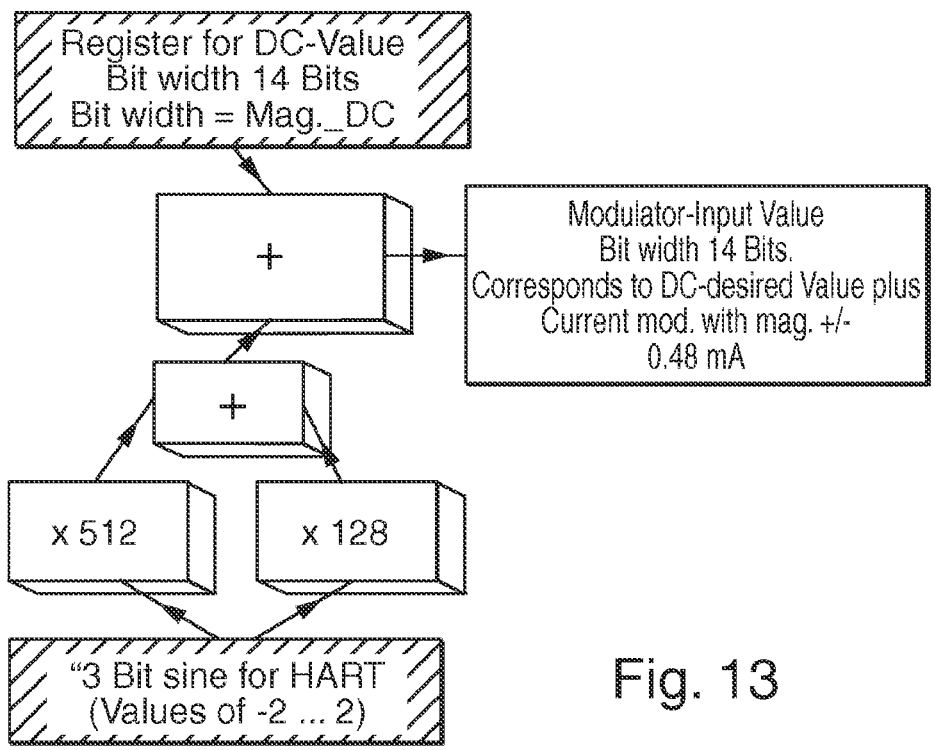
FIG. 13 is a flow diagram of a method for producing an input value for a digital digital-to-analog converter

FIG. 13 shows a flow diagram of a method for producing an input value for the digital digital-to-analog converter. For such purpose, an input value composed of 14 bits is produced. This input value is put together from the 3-bit sine and a value from the register for the direct current value. By multiplying the 3-bit sine and adding, the 3 bit sine signal is scaled or shifted. The input value resulting therefrom corresponds to the direct current signal to be set in the current loop plus the electrical current modulation of +−0.48 mA, i.e. the alternating current signal to be set.

Figure 14A:
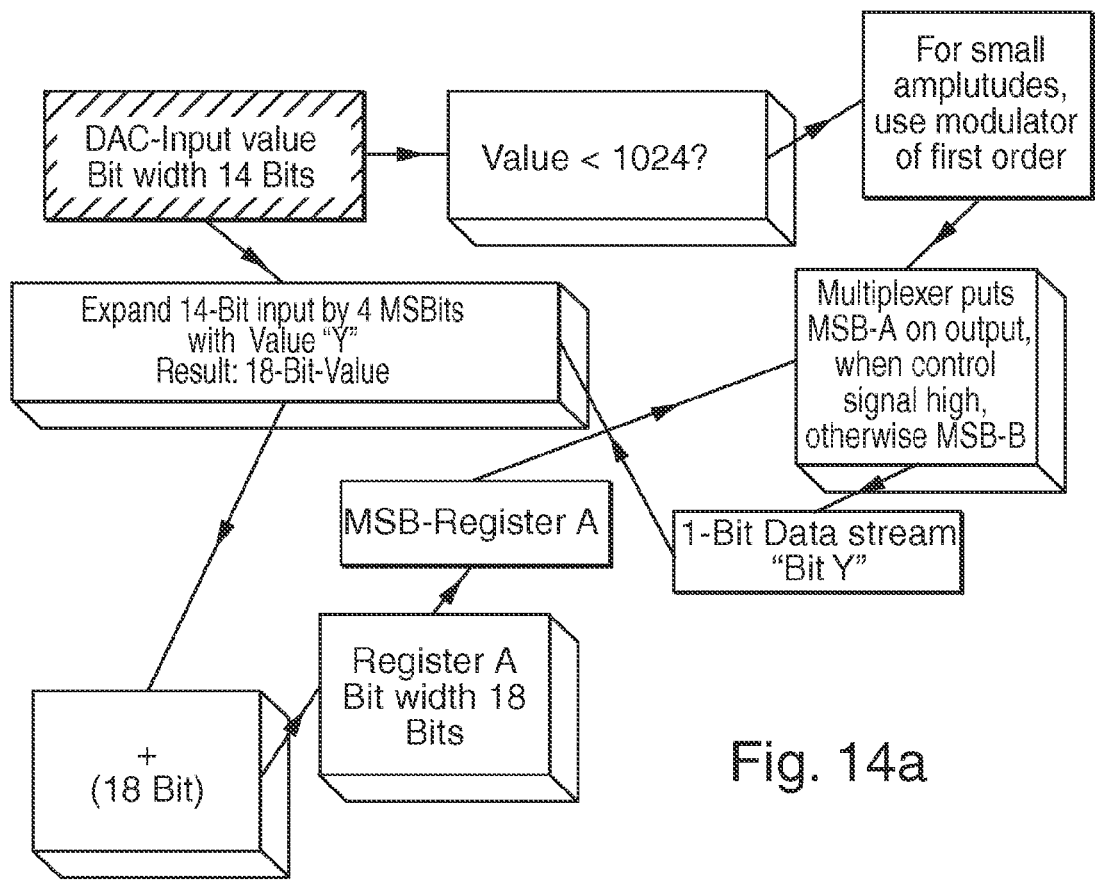
FIG. 14(a) is a first flow diagram of a method for operating a digital digital-to-analog converter

FIG. 14a shows a first flow diagram of a method for operating the digital digital-to-analog converter. The input value MOD_IN is first subjected to a case distinction, in order to detect whether its value corresponds to a low output value of the electrical current signal; for example, corresponds to less than 5 mA. For small amplitudes, a $1^{st}$ order delta-sigma modulator is then utilized or operated in the first order. If the input value lies over a threshold value, the digital digital-to-analog converter can be operated in the second order. For such purpose, the input value can, for example, first be expanded by four MSBits.

Figure 14B:
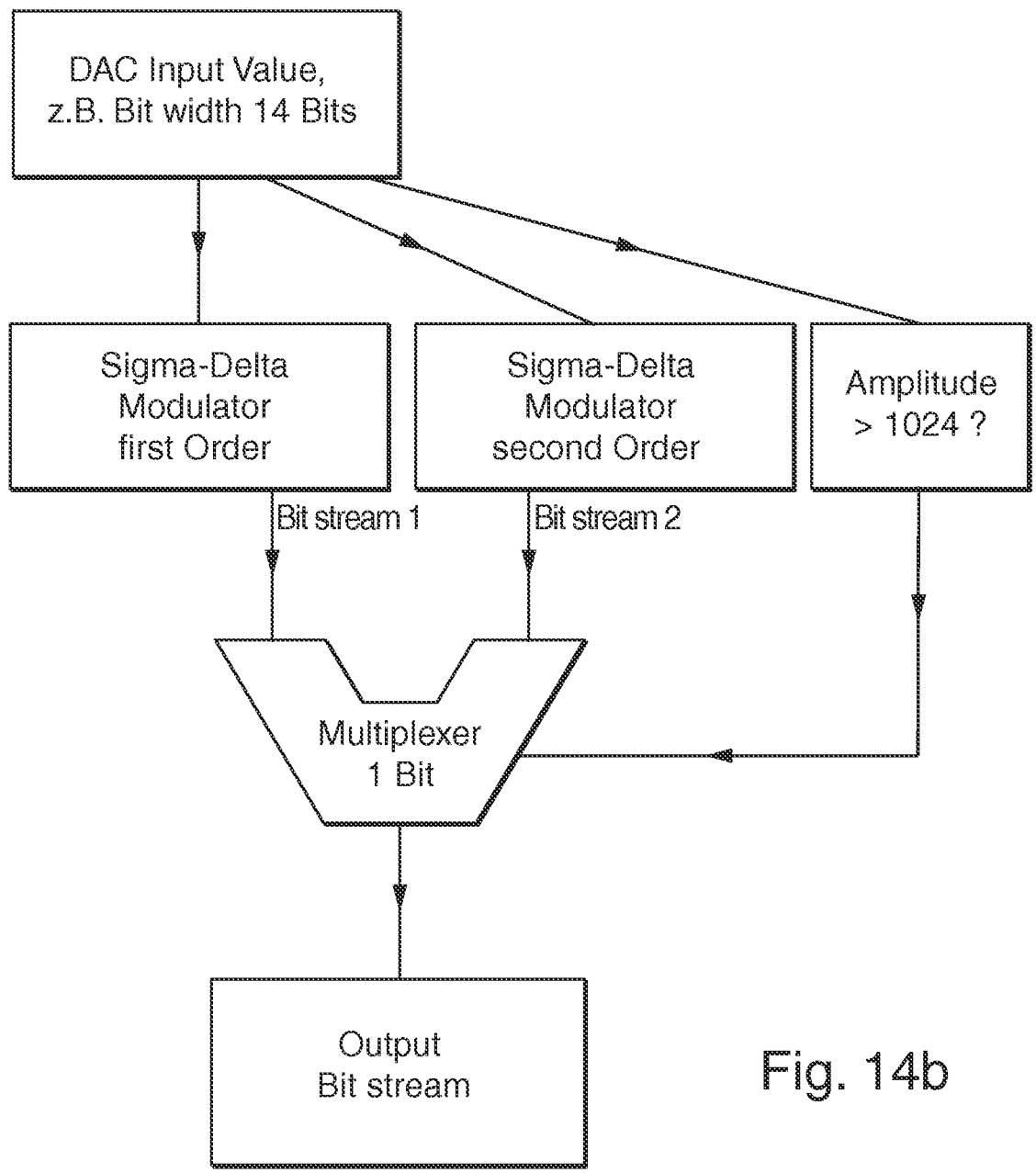
FIG. 14(b) is a second flow diagram of a method for operating a digital digital-to-analog converter
Figure 15A:
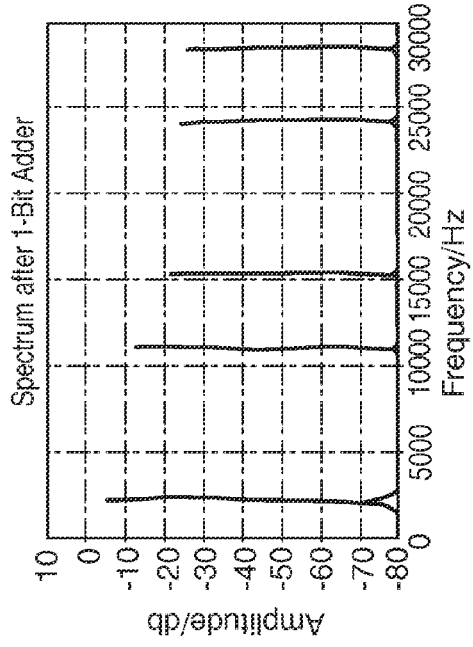
FIG. 15 is a spectrum of an AC signal to be set during various stages of the method of the producing.
Figure 15B:
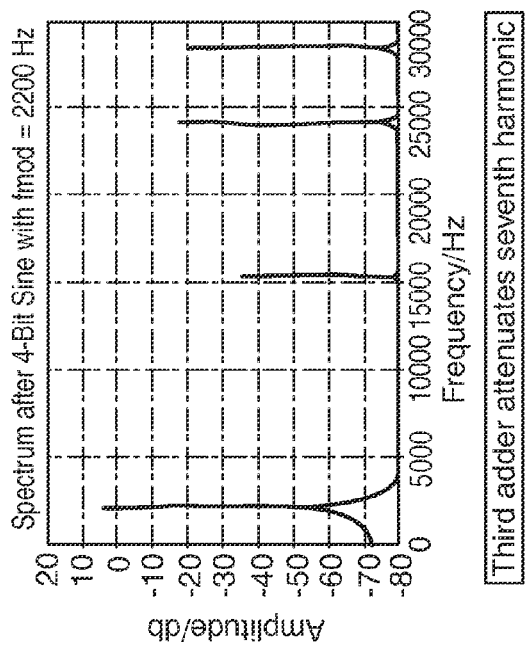
Figure 15C:
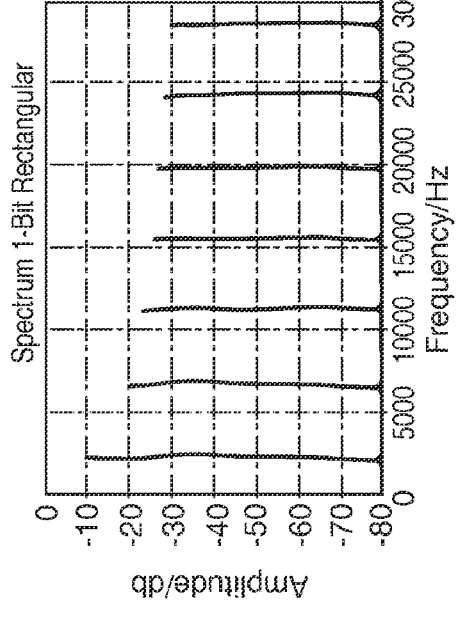
Figure 15D:
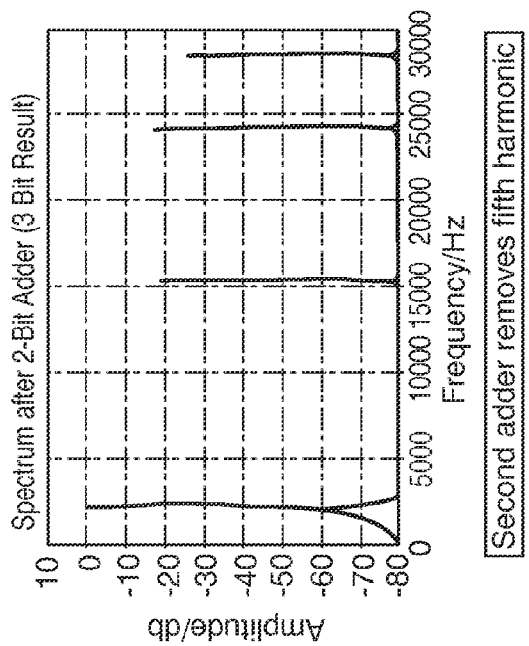

FIG. 14b shows a second flow diagram of the method. The input value MOD_IN is transmitted to a first order sigma-delta modulator, a second order delta-sigma modulator and to a comparison circuit, for example in parallel, as shown in FIG. 14b). The output signal of the first order delta-sigma modulator and the output signal of the second order delta-sigma modulator are, in each case, conveyed to the inputs of a multiplexer. The comparison circuit, which, as mentioned, also receives the input value MOD_IN, then emits a switching signal, by means of which is determined which of the inputs of the multiplexer is selected and connected through to the output of the multiplexer. The comparison circuit in such case tests whether the input value MOD_IN is greater or smaller than a threshold value, here e.g. 1024.

FIG. 15 a), b), c), d) shows a spectrum of the AC signal to be set during various stages of the producing. In FIG. 15 a), the spectrum of the 1-bit rectangle function is presented. The spectrum contains all uneven overtones. In FIG. 15 b) shows the spectrum after the first adder. The result of the adder is a 2 bit signal. Due to the addition, the 3rd and the 9th overtone can especially be completely removed. Finally, the second adder produces a 3 bit signal. Its spectrum is now also essentially—especially completely—free of the 5th overtone, and is presented in FIG. 15 c). In FIG. 15 d), finally, the spectrum for the case of a 4 bit signal is shown, in the case of which the $7^{th}$ overtone is also additionally attenuated.

Figure 16:
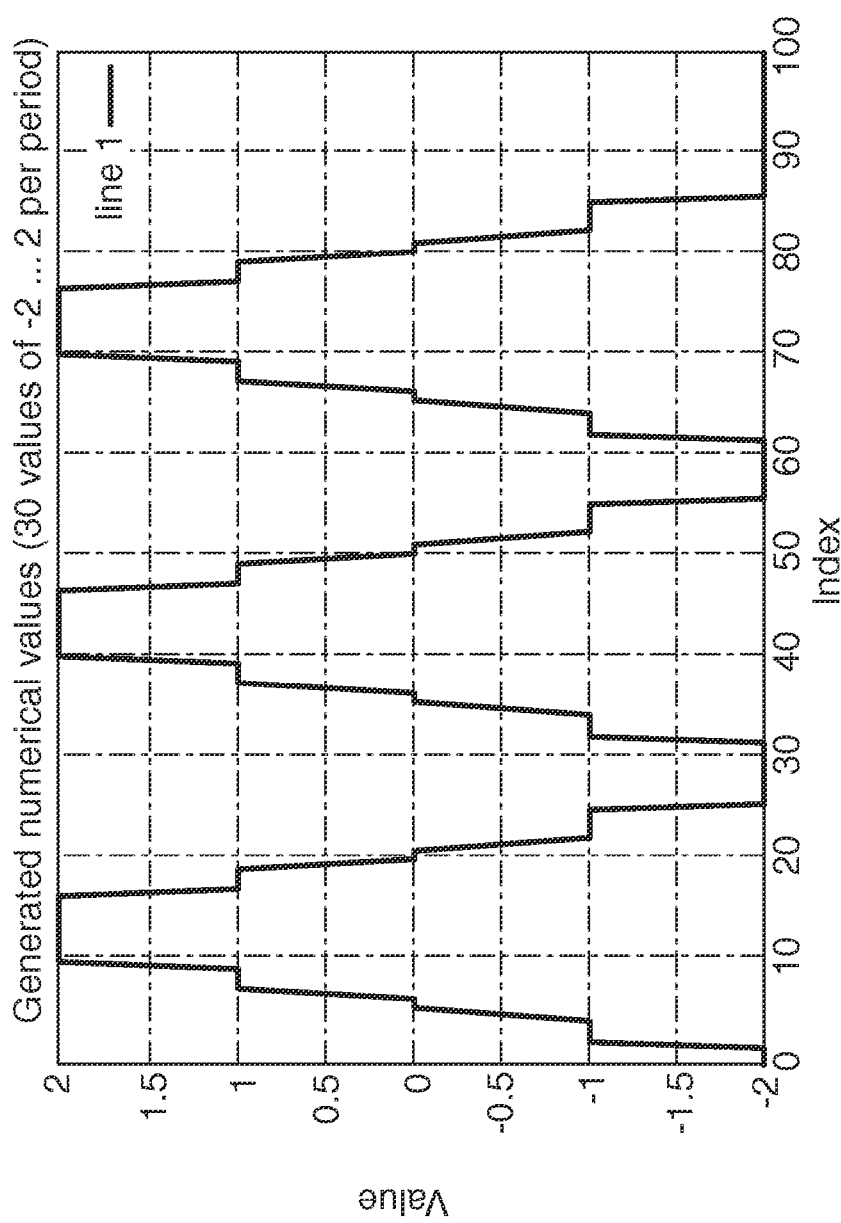
FIG. 16 is a schematic representation of a 3-bit sine signal as sequence of different numerical values.

FIG. 16 shows a 3-bit sine signal. A 3-bit signal can assume seven values. Five of these are used for producing the sinusoidal signal, or the number series representing the sine.

Figure 17:
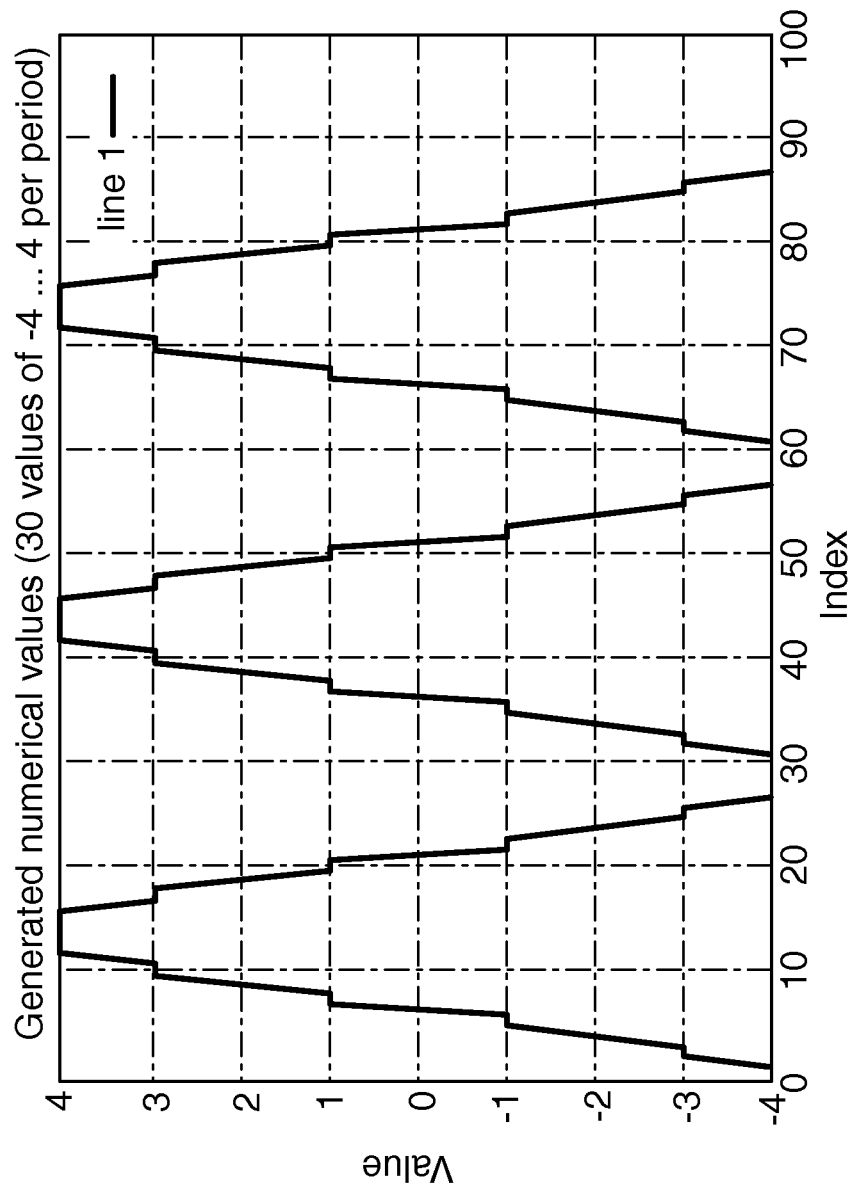
FIG. 17 is a schematic representation of a 4-bit sine signal as sequence of different numerical values.

FIG. 17 shows a schematic representation of an alternative embodiment in the form of a 4-bit sinusoidal signal. The 4 bit signal is composed, in such case, of a sequence of numerical values, wherein a numerical value in a format with the bit width of 4 bits is presented. In such case, it is not relevant whether the numerical value is generated via the switch network shown in FIG. 12, or e.g. via a so-called lookup table with the numerical values shown in FIGS. 16 and 17. In such case, generation via the switch network has, however, the advantage of requiring especially few logic resources. Also other number series than those shown in Tables 16 and 17 can fulfill the latter's purpose, e.g. a number series, which also completely attenuates the $7^{th}$ harmonic wave. This is based on the recognition that higher harmonic waves are not essential for the quality of the sine signal produced at the current loop, and, technically exploiting this recognition, digital sine generators can be utilized, which require a fraction of the gates required by sine generators, which also suppress harmonic waves greater than the $7^{th}$ order. As a measure of the relevant suppressing, it can, in such case, be specified that all harmonic waves of the generated 1.2 and 2.2 kHz sine values up to and including the $6^{th}$ order be attenuated by at least 30 dB, but that at least one harmonic wave of the $7^{th}$ or a higher order is, however, attenuated by a value of less than 30 dB relative to the amplitude of the fundamental wave.

Figure 18:
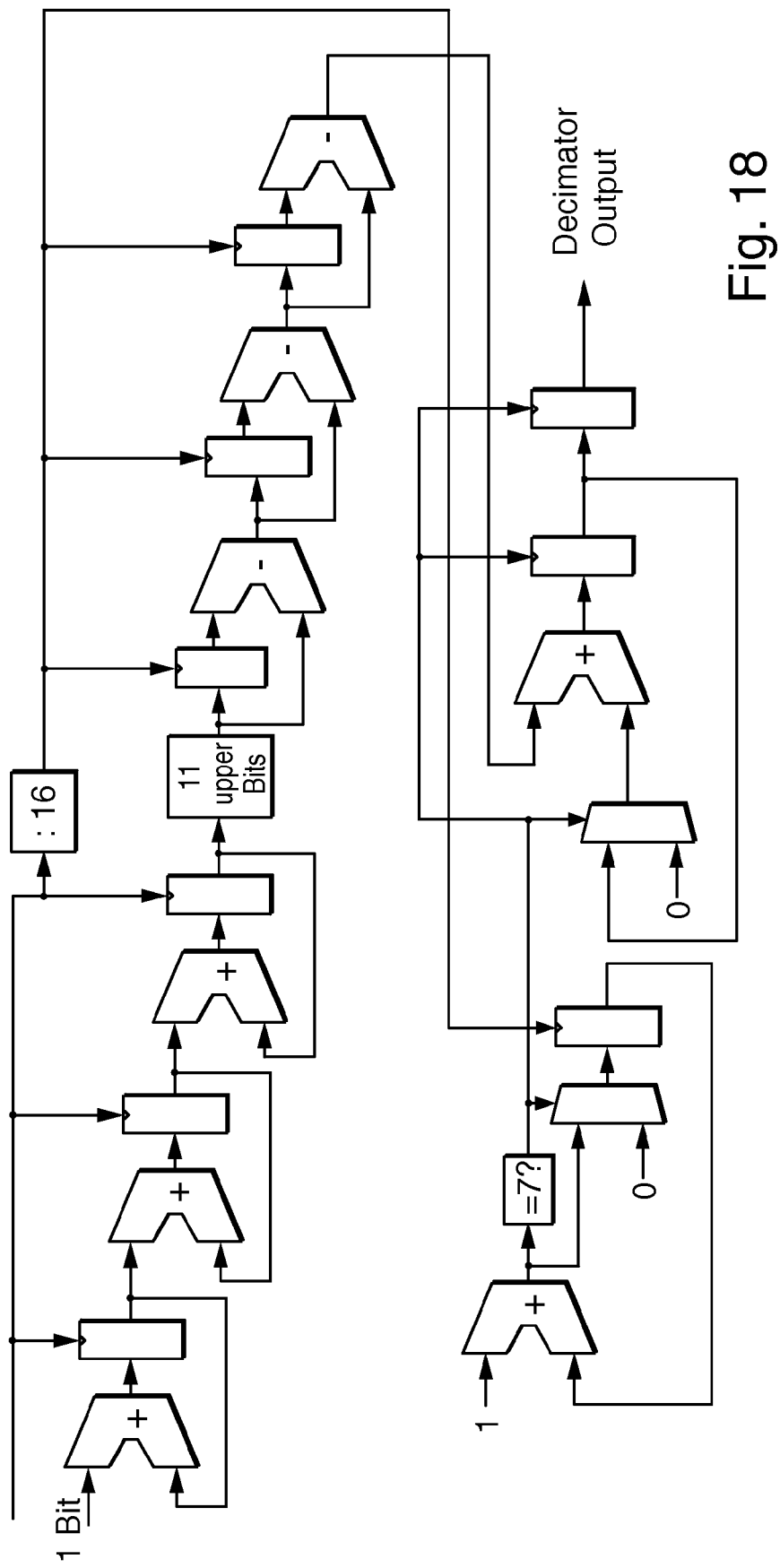
FIG. 18 is a schematic representation of a CIC decimation filter.

FIG. 18 shows a decimation filter. After sampling the electrical current signal set in the current loop, the sampled signal is, in a first step, further processed in a decimation filter. In such case, the sampling frequency is, for example, reduced. For such purpose, a cascaded integral comb filter (CIC filter for short), as shown in FIG. 18, can, for example, be used. The sampling of the electrical current signal in the current loop can, in such case, occur for example by means of an analog delta-sigma modulator.

Figure 19:
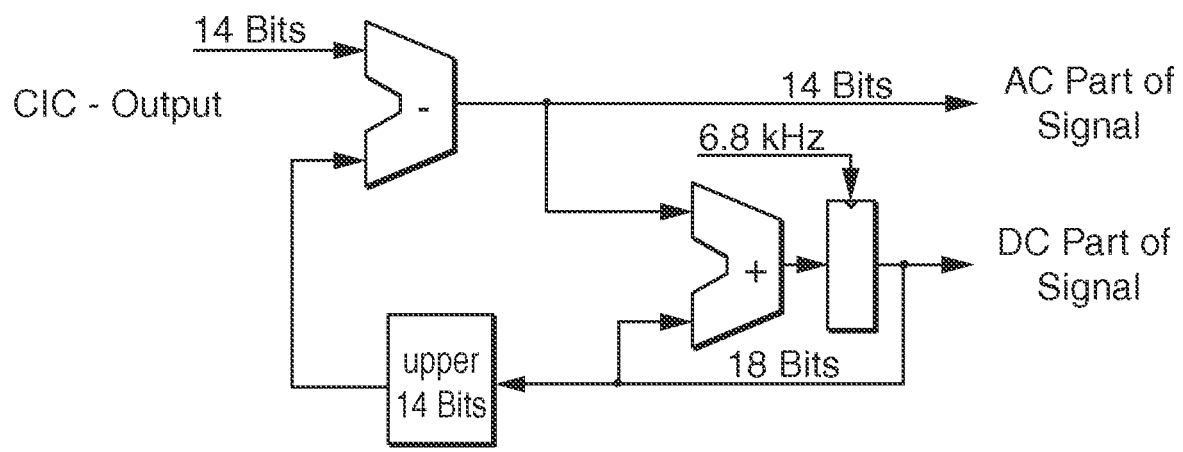
FIG. 19 is a schematic representation of a circuit for separation of the direct current and alternating current parts from the second data stream.

FIG. 19 shows a schematic representation of a circuit for separation of the direct current and alternating current part from the second data stream. The direct current signal is separated from the alternating current signal. For such purpose, a moving average filter, for example, cart be used. Here, the signal output by the CIC-filter serves as the input signal.

Figure 20:
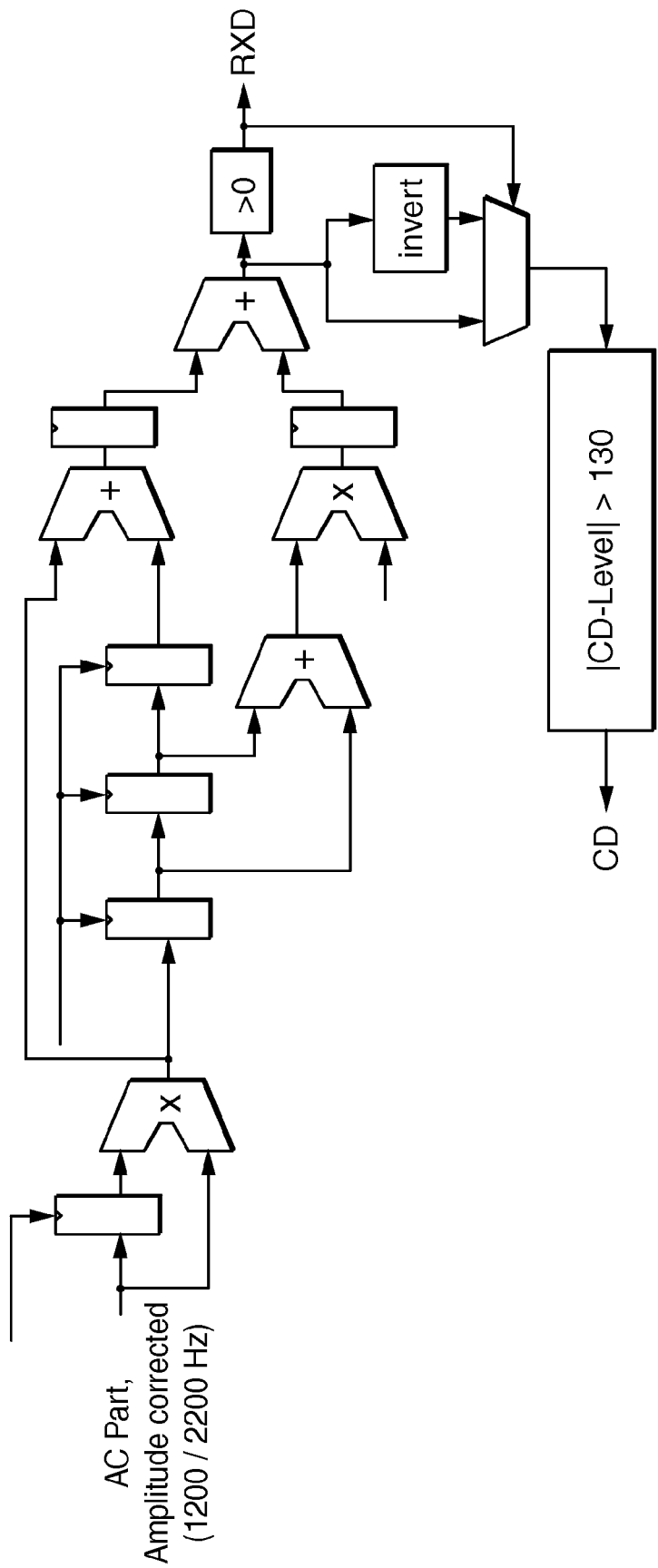
FIG. 20 is a schematic representation of a circuit for generating a carrier detect signal and an RxD signal.

FIG. 20 shows a schematic representation of a circuit for generating a CD and an RxD signal. The alternating current signal is converted into the RxD and the carrier detect signal. RxD and carrier detect are then transmitted back to the control unit.

The invention claimed is:

1. A method for signal transmission between a first and a second system, wherein the first and the second system connected with one another via a current loop, a direct current signal is transmitted in a first frequency range from 0-30 Hz and an alternating current signal is transmitted in a second frequency range from 100-10000 Hz via the current loop, the direct current signal and the alternating current signal are superimposed, wherein the direct current signal and alternating current to be set in the current loop are encrypted in a digital manner, the alternating current signal is used for digital signal transmission and the direct current signal is used for analog signal transmission, comprising the steps of:

producing by means of a control unit, said first data stream, in which the direct current signal and the alternating current signal to be set in the current loop are digitally encrypted;

transmitting the first data stream to an electrical current output circuit; and converting the transmitted first data stream by the electrical current output circuit into an electrical current signal, wherein:

the electrical current signal is composed of the superimposed direct current signal and alternating current signal, or that the transmitted first data stream is converted by the electrical current output circuit into the direct current signal and the alternating current signal; and the electrical current signal or the direct current signal and the alternating current signal are set in the current loop.

2. The method for signal transmission as claimed in claim 1, wherein:

at least a first control signal, in which the alternating current signal and direct current signal to be set in the current loop are digitally encrypted, is produced by the control unit, and at least a second control signal is produced by the control unit, in which the direct current signal to be set in the current loop is digitally encrypted.

3. The method for signal transmission as claimed in claim 2, wherein:

by means of the first control signal, at least one numerical value is produced, which corresponds to the alternating current signal to be set.

4. The method for signal transmission as claimed in claim 2, wherein:

by means of the first control signal, a sequence of numerical values is produced, wherein the sequence corresponds to the alternating current signal to be set.

5. The method for signal transmission as claimed in claim 3, wherein:

the numerical value or individual numerical values of the sequence are produced in a format with a bit width of n bits, wherein n is a natural number, especially three or four.

6. The method for signal transmission as claimed in claim 2, wherein:

by means of the second control signal, a numerical value corresponding to the direct current signal to be set, especially with a bit width of less than m bits, is produced, wherein m is a natural number.

7. The method for signal transmission as claimed in claim 6, wherein:

at least one numerical value of the sequence, which represents the alternating current signal, is scaled, especially to the bit width of the numerical value of the DC signal.

8. The method for signal transmission as claimed in claim 6, wherein:

at least one numerical value of the sequence representing the alternating current signal, and the numerical value of the DC signal to be set, are combined, especially added, and are converted into the first data stream.

9. The method for signal transmission as claimed in claim 8, wherein:

said conversion is performed by means of a digital delta-sigma modulator, wherein:

the digital delta-sigma modulator is operated in first or second order dependent on an input value, the input value being dependent on the direct current signal and/or alternating current signal to be set; and the input value is derived especially from at least one numerical value of the sequence, which corresponds to the alternating current signal to be set and/or to the numerical value of the DC signal to be set.

10. The method for signal transmission as claimed in claim 1, wherein:

the direct current signal and the alternating current signal set in the current loop are converted into a second data stream;

the direct current signal and the alternating current signal are digitally encrypted in the second data stream, and the second data stream is transmitted back from the electrical current output circuit to the control unit.

11. The method for signal transmission as claimed in claim 1, wherein:

the superimposed direct current and alternating current signal set in the current loop is sampled and converted into a second data stream.

12. The method for signal transmission as claimed in claim 11, wherein:

the sampling rate of the second data stream is lessened, especially by means of a decimation filter.

13. The method for signal transmission as claimed in claim 12, wherein:

from the especially decimated second data stream, especially a decimated second data stream, a first numerical value is ascertained, which represents the direct current and alternating current signal set in the current loop.

14. The method for signal transmission as claimed in claim 13, wherein:

from the first numerical value, a second numerical value is derived, which corresponds to the direct current signal set in the current loop, and from the first numerical value, a third numerical value is derived, which corresponds to the alternating current signal set in the current loop.

15. The method for signal transmission as claimed in claim 14, wherein:

a frequency response correction of the sampled especially decimated direct current and/or alternating current signal, especially a decimated signal, is performed.

16. The method for signal transmission as claimed in claim 15, wherein:

the third numerical value is converted or decoded, especially by means of a quadrature demodulator, into signals readable by the control unit and transmitted to the control unit.

17. The method for signal transmission as claimed in claim 1, wherein:

the first data stream and/or the second data stream are transmitted across a galvanic barrier.

18. The method for signal transmission as claimed in claim 1, wherein:

a value of the DC signal and/or AC signal set in the current loop and transmitted back is compared with a desired value by means of the control unit.

19. The method for signal transmission as claimed in claim 1, wherein:

an operating mode is provided, in which operating mode a maximum value of the DC signal settable in the current loop is predetermined by means of the first data stream, in which operating mode the value of the DC signal in the current loop is furthermore limited by a unit provided in the second system to a value smaller than or equal to predetermined the maximal value, and in which operating mode the value of the DC signal set in the current loop is transmitted via the second data stream to the control unit.

20. The method for signal transmission as claimed in claim 1, wherein:
the alternating current signal set in the current loop is an essentially sinusoidal, alternating current signal; and
overtones of the sinusoidal AC signal up to and including 6th order are attenuated by a value of at least 30 dB relative to the amplitude of the fundamental oscillation of the sinusoidal AC signal.

21. The method for signal transmission as claimed in claim 20, wherein:
at least one overtone of 7th order or a higher order is attenuated by a value of less than 30 dB relative to the amplitude of the fundamental oscillation.

22. An electrical and/or electronic circuit for signal transmission between a first and a second system, said first and said second system are connected with one another via a current loop, wherein the current loop serves to transmit a direct current signal in a first frequency range from 0-30 Hz and an alternating current signal in a second frequency range from 100-10000 Hz, wherein the alternating current signal and the direct current signal are superimposed, wherein the direct current signal and alternating current to be set in the current loop are encrypted in a digital manner, and wherein the direct current signal serves for analog signal transmission and the alternating current signal serves for digital signal transmission, comprising:
a control unit, which serves for producing said first data stream, which the direct current signal and alternating current signal to be set in the current loop are digitally encrypted;
an electrical current output circuit in said second system; and
a first transmission unit, which serves to transmit said first data stream to said electrical current output circuit, wherein:
said electrical current output circuit serves to convert said transmitted first data stream into an electrical current signal; and
said electrical current signal is composed of the superimposed direct current signal and alternating current signal, or the electrical current output circuit serves to convert the transmitted first data stream into the direct current signal and the alternating current signal.

23. The electrical and/or electronic circuit as claimed in claim 22 further comprising:
a digital switching unit, which serves for producing said first data stream, especially the AC signal to be set in said current loop, by means of a first control signal-especially a digital control signal-output by said control unit.

24. The electrical and/or electronic circuit as claimed in claim 23, wherein:
said control unit has a digital communication interface, especially a serial digital communication interface, and the digital communication interface serves for transmission between said digital switching unit and said control unit of control signals representing the alternating current signal to be set.

25. The electrical and/or electronic circuit as claimed in claim 24, wherein:
said digital switching unit serves to produce from the control signals transmitted by said control unit via the digital communication interface at least one numerical value or a sequence of numerical values;
the numerical value or the sequence corresponds to the alternating current signal to be set in said current loop; and
the numerical values are especially presented in a format with a bit width of n bits.

26. The electrical and/or electronic circuit as claimed in claim 25, further comprising:
a register, which is operable from said control unit, especially by means of a second control signal, and serves to output a numerical value corresponding to the direct current signal to be set, wherein:
the numerical value is presented in a format with a bit width of m bits.

27. The electrical and/or electronic circuit as claimed in claim 22, further comprising:
a first signal processing unit, which includes a digital sigma-delta modulator, which serves to produce said first data stream, especially from the numerical value that represents the direct current signal and the alternating current signal.

28. The electrical and/or electronic circuit as claimed in claim 27, wherein:
said sigma-delta modulator is embodied in such a manner, that said sigma-delta modulator is operable in a first or second order as a function of an input value derivable from the alternating current signal and direct current signal to be set in said current loop.

29. The electrical and/or electronic circuit as claimed in claim 22, further comprising:
a synchronizing unit, which serves to synchronize the transmitted first data stream with a predetermined clock signal.

30. The electrical and/or electronic circuit as claimed in claim 22, wherein:
said electrical current output circuit has a first filter with a low-pass characteristic curve, which converts the transmitted first data stream into an analog voltage.

31. The electrical and/or electronic circuit as claimed in claim 22, wherein:
the electrical and/or electronic components of the electrical current output circuit are spatially surrounded by electrically conductive traces; and
the conductive traces are actively held to essentially the same DC potential as the electrical and/or electronic components.

32. The electrical and/or electronic circuit as claimed in claim 22, wherein:
said current output circuit has a second signal processing unit, which converts the direct current signal and/or alternating current signal set in said current loop into a second data stream; and
the direct current signal and the alternating current signal are digitally encrypted in said second data stream.

33. The electrical and/or electronic circuit as claimed in claim 32, wherein:
said second signal processing unit has an analog delta-sigma modulator, which serves to produce said second data stream.

34. The electrical and/or electronic circuit as claimed in claim 33, wherein:
a loop filter of said analog delta-sigma modulator used for modulation is a time-continuous filter.

35. The electrical and/or electronic circuit as claimed in claim 22, further comprising:
a second transmission unit, which serves to transmit said second data stream to said control unit.

36. The electrical and/or electronic circuit as claimed in claim 22, further comprising:
a decimation filter, especially a CIC filter, which serves to change the sampling rate of said second data stream.

37. The electrical and/or electronic circuit as claimed in claim 36 wherein:
said decimation filter outputs a numerical value or a sequence of numerical values, which represents the direct current signal and the alternating current signal set in said current loop.

38. The electrical and/or electronic circuit as claimed in claim 22, further comprising:
a filter, especially a moving average filter, which separates from one another a first part of the numerical value and a second part of the numerical value which represent the direct current signal and the alternating current signal set in the current loop, wherein:
said first part corresponds to the alternating current signal set in said current loop, and the second part corresponds to the direct current signal set in said current loop.

39. The electrical and/or electronic circuit as claimed in claim 26, wherein:
said register additionally serves to process the second part of the numerical value.

40. The electrical and/or electronic circuit as claimed in claim 38, wherein:
said first part is fed to a quadrature demodulator, which produces signals readable by said control unit, especially an RxD signal and a carrier detect signal.

41. The electrical and/or electronic circuit as claimed in claim 40, wherein:
said RxD signal and the carrier detect signal are deliverable via the digital communication interface UART of said control unit.

42. The electrical and/or electronic circuit as claimed in claim 22, wherein:
the alternating current signal set in said current loop is an essentially sinusoidal, alternating current signal; and
overtones of the sinusoidal AC signal up to and including 6th order are attenuated by a value of at least 30 dB relative to the amplitude of the fundamental oscillation of the sinusoidal AC signal.

43. The electrical and/or electronic circuit as claimed in claim 42, wherein:
at least one overtone of 7th order or a higher order is attenuated by a value of less than 30 dB relative to the amplitude of the fundamental oscillation.

44. The electrical and/or electronic circuit as claimed in claim 22, wherein:
the first system comprises only digital components.

45. The electrical and/or electronic circuit as claimed in claim 22, wherein:
said first data stream is a bit stream.

46. A field device of process and/or automation technology having an electrical and/or electronic circuit, comprising:
a control unit, which serves for producing a first data stream, which the direct current signal in a first frequency range from 0-30 Hz and alternating current signal in a second frequency range from 100-10000 Hz to be set in the current loop are digitally encrypted;
an electrical current output circuit; and
a first transmission unit, which serves to transmit said first data stream to said electrical current output circuit, wherein:
said electrical current output circuit serves to convert said transmitted first data stream into an electrical current signal; and
said electrical current signal is composed of the superimposed direct current signal and alternating current signal, or the electrical current output circuit serves to convert the transmitted first data stream into the direct current signal and the alternating current signal.

47. The field device of process and/or automation technology as claimed in claim 46, wherein:
said field device is an actuator or a measuring transducer/sensor.

48. The field device of process and/or automation technology as claimed in claim 46, wherein:
said first data stream is a bit stream.

\* \* \* \* \*